US006973722B2

(12) United States Patent
Hantschel et al.

(10) Patent No.: US 6,973,722 B2
(45) Date of Patent: Dec. 13, 2005

(54) RELEASE HEIGHT ADJUSTMENT OF STRESSY METAL DEVICES BY ANNEALING BEFORE AND AFTER RELEASE

(75) Inventors: Thomas Hantschel, Menlo Park, CA (US); David K. Fork, Los Altos, CA (US); Dirk De Bruyker, Palo Alto, CA (US); Chinnwen Shih, Santa Clara, CA (US); Jeng Ping Lu, San Jose, CA (US); Christopher L. Chua, San Jose, CA (US); Raj B. Apte, Palo Alto, CA (US); Brent S. Krusor, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 139 days.

(21) Appl. No.: 10/715,978

(22) Filed: Nov. 17, 2003

(65) Prior Publication Data

US 2005/0102833 A1    May 19, 2005

(51) Int. Cl.[7] ............................................. H01R 43/16
(52) U.S. Cl. ............................. 29/874; 29/876; 29/882; 29/884; 438/461; 438/611
(58) Field of Search ......................... 29/874, 876, 884; 438/461, 611

(56) References Cited

U.S. PATENT DOCUMENTS

| | | | | |
|---|---|---|---|---|
| 5,613,861 A | * | 3/1997 | Smith et al. | .................. 439/81 |
| 5,848,685 A | * | 12/1998 | Smith et al. | ................ 200/275 |
| 5,914,218 A | * | 6/1999 | Smith et al. | ................ 430/320 |
| 5,944,537 A | | 8/1999 | Smith et al. | |
| 6,183,267 B1 | | 2/2001 | Marcus et al. | |
| 6,184,065 B1 | * | 2/2001 | Smith et al. | ................ 438/117 |
| 6,184,699 B1 | * | 2/2001 | Smith et al. | ................ 324/762 |
| 6,221,750 B1 | * | 4/2001 | Fjelstad | ...................... 438/611 |
| 6,264,477 B1 | * | 7/2001 | Smith et al. | .................. 439/66 |
| 6,299,462 B1 | | 10/2001 | Bielgelsen | |
| 6,352,454 B1 | | 3/2002 | Kim et al. | |
| 6,396,677 B1 | * | 5/2002 | Chua et al. | ................ 361/278 |
| 6,582,989 B2 | | 6/2003 | Biegelsen et al. | |
| 6,606,235 B2 | * | 8/2003 | Chua et al. | ................ 361/278 |
| 6,791,171 B2 | * | 9/2004 | Mok et al. | ................... 257/678 |
| 6,815,961 B2 | * | 11/2004 | Mok et al. | ................... 324/754 |

OTHER PUBLICATIONS

Despont et al.: "Wafer-Scale Microdevice Transfer/Interconnect: From A New Integration Method To Its Application In An AFM-Based Data-Storage System", 2003 IEEE, 12th International Conference on Solid State Sensors, Actuators and Microsystems, Boston, Jun. 8-12, 2003, pp. 1907-1910.

* cited by examiner

*Primary Examiner*—Carl J. Arbes
(74) *Attorney, Agent, or Firm*—Bever, Hoffman & Harms LLP; Patrick T. Bever

(57) ABSTRACT

Spring structures are subjected to pre-release and post-release annealing to tune their tip height to match a specified target. Post-release annealing increases tip height, and pre-release annealing decreases tip height. The amount of tuning is related to the annealing temperature and/or time. Annealing schedules are determined for a pre-fabricated cache of unreleased spring structures such that finished spring structures having a variety of target heights can be economically produced by releasing/annealing the cache according to associated annealing schedules. Selective annealing is performed using lasers and heat absorbing/reflecting materials. Localized annealing is used to generate various spring structure shapes. Both stress-engineered and strain-engineered spring structures are tuned by annealing.

61 Claims, 10 Drawing Sheets

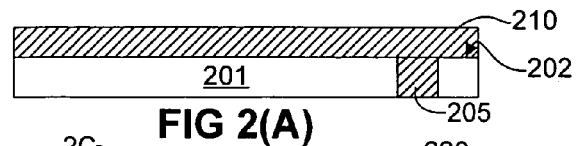
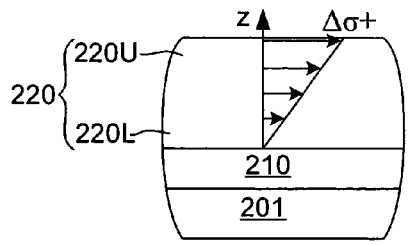
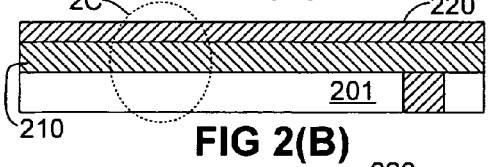
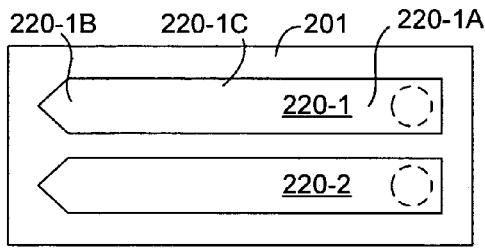
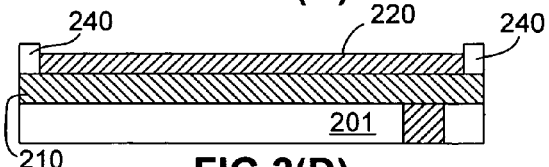
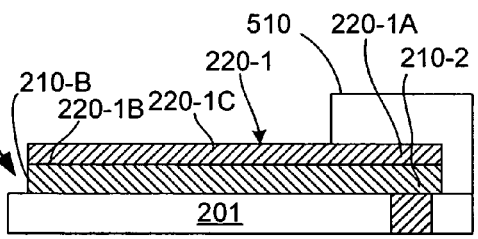
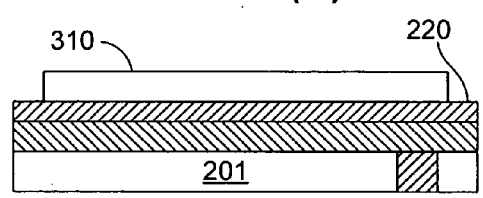
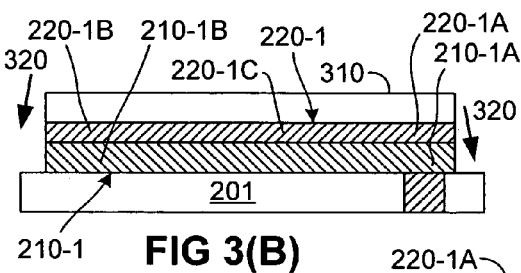
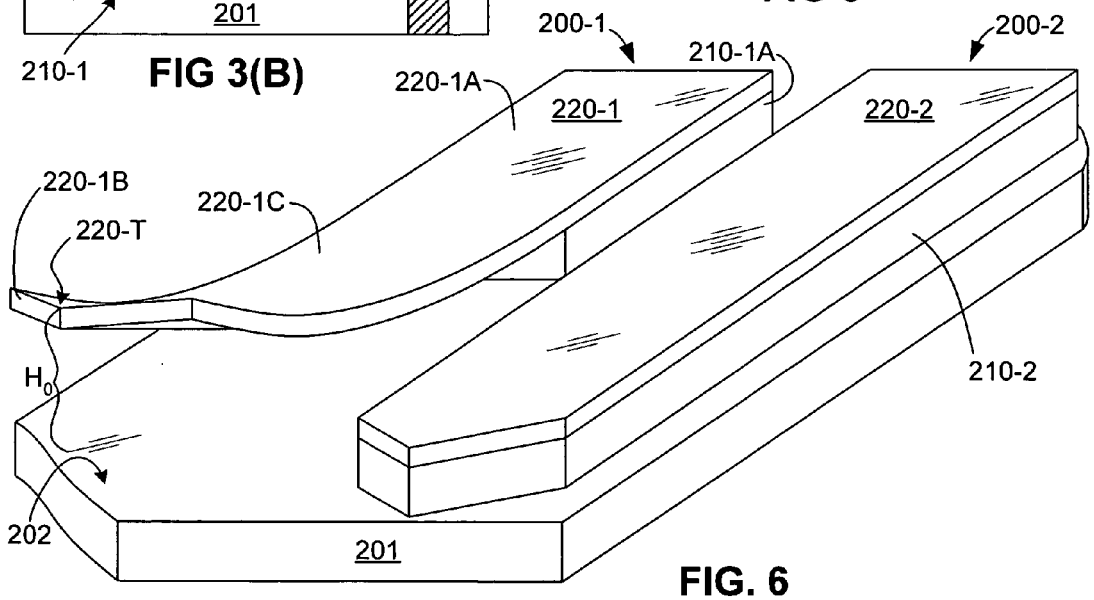

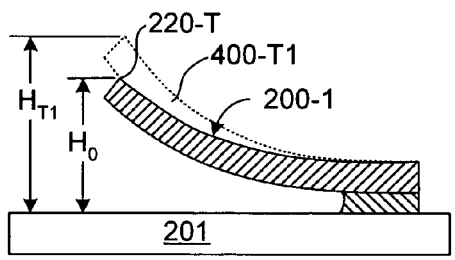
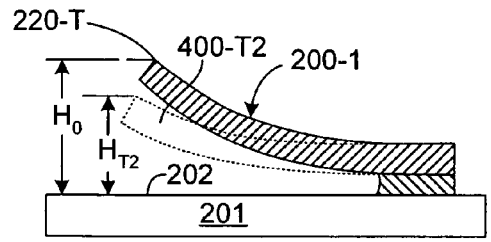
FIG. 7(A)  FIG. 7(B)
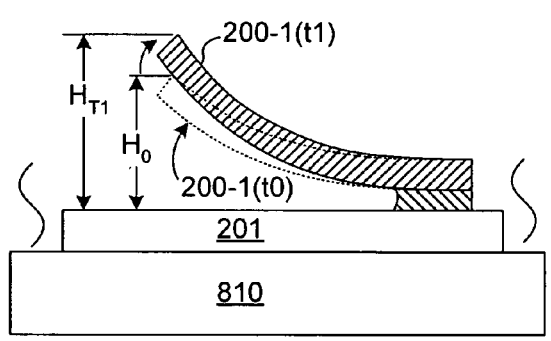
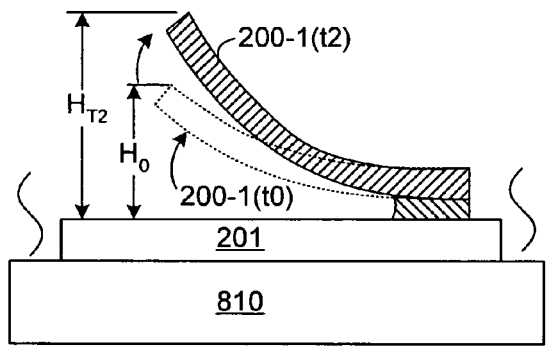
FIG. 8(A)  FIG. 8(B)
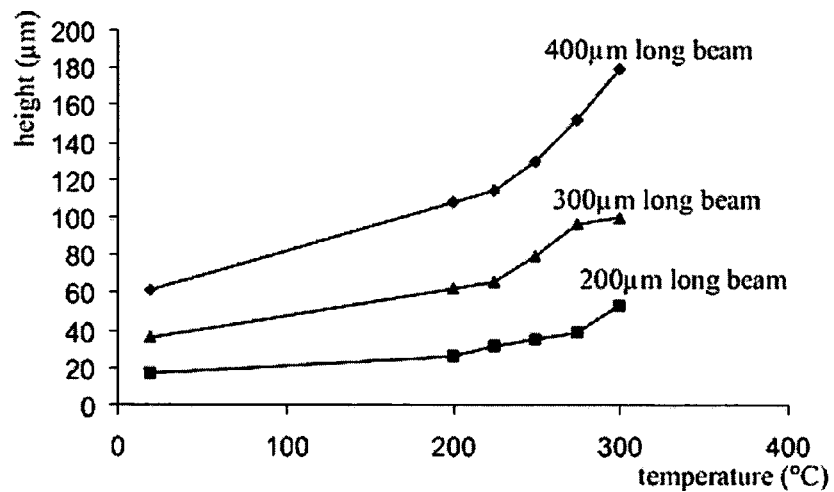
FIG. 9

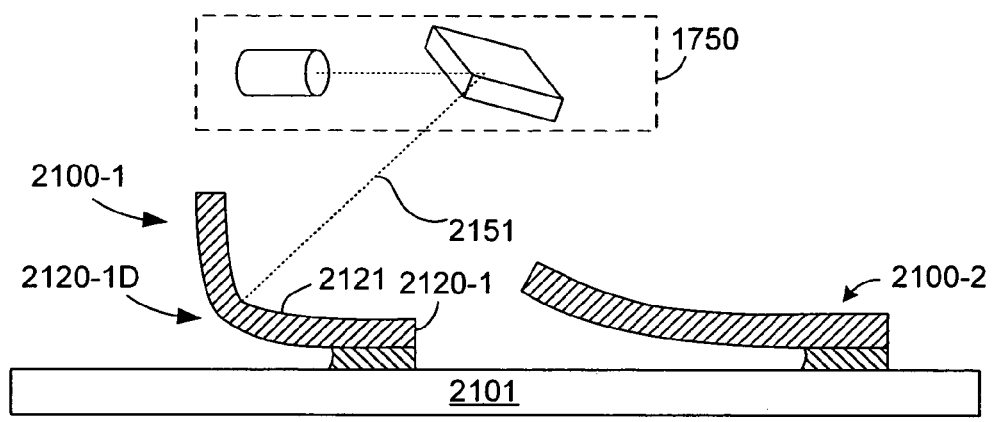
FIG. 21
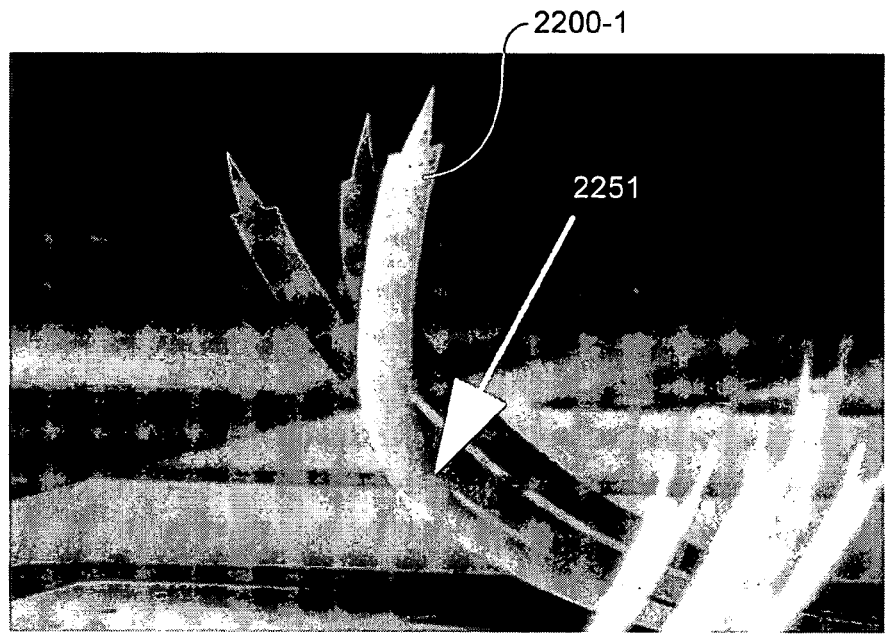
FIG. 22
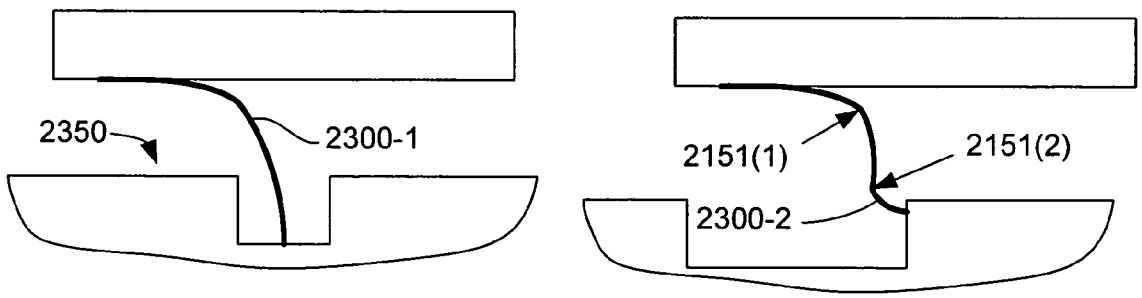
FIG. 23(A)          FIG. 23(B)

RELEASE HEIGHT ADJUSTMENT OF STRESSY METAL DEVICES BY ANNEALING BEFORE AND AFTER RELEASE

FIELD OF THE INVENTION

This invention relates generally to spring structures formed from stress-engineered or strain-engineered films, and in particular to inexpensive methods for mass-producing such spring structures.

BACKGROUND

FIG. 27 is a perspective view showing an exemplary photo-lithographically patterned spring structure 2700 (sometimes referred to as a "microspring") that has been developed, for example, to produce low cost probe cards, and to provide electrical connections between integrated circuits. Spring structure 2700 includes a spring metal finger 2720 having a fixed end (anchor portion) 2720A secured to an underlying substrate 2701, a free end 2720B defining a tip 2720T, and a central section 2720C extending between fixed end 2720A and free end 2720B. Fixed end 2720A is connected to substrate 2701 by way of an intervening release material portion 2710 such that a cantilevered structure is formed with free end 2720B and central portion 2720C extending over an upper surface 2702 of substrate 2701. Spring metal finger 2720 is typically formed from a stress-engineered metal film having an internal stress gradient (i.e., a metal film fabricated such that its lower portions have a higher internal compressive stress than its upper portions) that is at least partially formed on a release material layer. This internal stress gradient causes central portion 2720C to bend away from substrate 2701 when the release material located under central section 2720C is etched away during a so-called "release" process. The internal stress gradient is produced in the spring metal by, for example, layering different metals having the desired stress characteristics, or using a single metal by altering the fabrication parameters. Such spring metal structures may be used in probe cards, for electrically bonding integrated circuits, circuit boards, and electrode arrays, and for producing other devices such as inductors, variable capacitors, scanning probes and actuated mirrors. For example, when utilized in a probe card application, the spring structure tip is brought into contact with a contact pad formed on an integrated circuit, and signals are passed between the integrated circuit and test equipment via the probe card (i.e., using the spring metal structure as a conductor). Other examples of such spring structures are disclosed in U.S. Pat. No. 3,842,189 (Southgate) and U.S. Pat. No. 5,613,861 (Smith).

As indicated in FIG. 27, a critical feature of spring structure 2700 is its tip height H, which is typically measured from tip 2720T to upper surface 2702 of substrate 2701 in a direction perpendicular to upper surface 2702. Tip height H is a product of the length of spring metal finger 2720 and the amount of bending produced in central section 2720C by the internal stress gradient upon release. As mentioned above, the length of spring metal finger 2720 is defined using well-established photo-lithographic techniques, and the stress gradient is defined, for example, by manipulating the process parameters during formation of the stress-engineered film. Therefore, to produce spring structures according to conventional manufacturing methods that meet a customer's specification (i.e., having a specified "target" tip height and specific spring constant), a spring structure manufacturer will select a spring film material, spring finger length, and set of process parameters that will produce the desired spring structure.

According to conventional methods currently utilized by spring structure manufacturers, stress calibration runs are used to determine the optimal process parameters needed to produce spring structures that meet a customer's specifications. For example, when a stress-engineered film is formed by sputter deposition, a calibration run is used to determine the rate at which chamber pressure is changed in order to produce the desired stress gradient (and, thus, the target tip height). It typically takes several calibration runs to identify the optimal process parameters needed to produce spring structures having the target tip height upon release. The thus-determined optimal process parameters are then repeatedly used to produce several batches (production runs) of spring structures meeting the customer's specifications. That is, the conventional method assumes that these determined optimal process parameters to be valid for many production runs following a successful stress calibration run.

A problem with the conventional method of relying on stress calibration runs to determine optimal process parameters is that, in practice, the operating parameters of fabrication (e.g., deposition chamber) equipment tend to drift over the course of several production runs, for example, due to target wear. For example, as indicated in FIG. 28(A), optimal process parameters may be determined to produce a desired spring structure 2700A, but parameter drift may cause an undesirable internal stress gradient, resulting in an actual spring structure 2700B having a release height $H_B$ that is less than the target release (tip) height $H_T$. Conversely, as indicated in FIG. 28(B), the process parameters may drift such that an actual spring structure 2700C is produced having a release height $H_C$ that is greater than the target release height $H_T$. This process parameter drift may be attributed to various factors, such as target erosion and chamber history, which are typically not easily detectable during the sequence of production runs. Accordingly, the stress gradients of the stress-engineered films tend to change over the course of several production runs. Further, because the deposition of the stress-engineered film is typically performed at a different time and in different equipment from the release process, it is difficult for a manufacturer to detect when the process parameters have drifted to a point where the resulting spring structures are no longer usable. Because several hundred spring structures are typically produced during each production run, a significant number of unacceptable ("out-of-spec") spring structures are typically discarded to produce a suitable number of acceptable ("in-spec") spring structures, which results in low production yields and high overall production costs.

One conventional approach used to avoid the parameter drift problem described above is to frequently recalibrate the deposition equipment. That is, after a successful calibration run, the thus-identified optimal process parameters are used for a number of runs, and then one or more additional calibration runs are used to identify drift and recalibrate the process parameters. However, frequently recalibration is a time-consuming procedure that greatly increases production costs. Thus, the parameter drift problem described above presents a serious obstacle for the industrial (mass fabrication) implementation of photo-lithographically produced spring structures.

Accordingly, what is needed is a method for fabricating photo-lithographically produced spring structures that does not rely on process (e.g., sputter) parameters to define a specific release height.

SUMMARY

The present invention is directed to a method for producing spring structures from that utilizes annealing to accurately adjust the tip height of the spring structures to meet a selected target tip height (distance) that is specified, for example, by the manufacturer's customer. The present inventors have found that annealing a spring structure of the type disclosed below after release (referred to herein as "post-release annealing") causes the spring structure to increase its curvature, thereby increasing the tip height of the spring structure, and that the post-release annealing temperature directly corresponds to the amount of increased curvature. The present inventors have also found that annealing a spring structure of the type disclosed below before release (referred to herein as "pre-release annealing") causes the spring structure to flatten out, thereby decreasing the release (initial) tip height of the resulting spring structure, and that the pre-release annealing temperature directly corresponds to the amount of flattening. Accordingly, by selectively applying pre-release and/or post-release annealing processes at one or more particular annealing temperatures, the present invention provides a method for "tuning" (adjusting) the tip height of spring structures associated with an entire production run to the selected target tip height in a manner that is substantially independent of the process parameters used to make the spring structure. Accordingly, the present invention obviates the need for the costly and time-consuming calibration run process used in conventional methods, and substantially reduces overall production costs by converting "out-of-spec" spring structures into "in-spec" spring structures, thereby increasing production yields.

According to an embodiment of the present invention, the production of a spring structure having a selected target tip height (i.e., a spring structure having a tip that is a selected target distance from the underlying substrate) begins by fabricating a stress-engineered or strain-engineered thin metal film over a substrate, and processing the thin metal film to form several unreleased elongated spring structures (islands) that are attached along their entire length to the substrate. A benchmark spring structure is then selected and released to determine a benchmark tip height, which indicates the predicted release tip height of the remaining (unreleased) spring structures. That is, because all of the spring structures on the wafer are formed at substantially the same time (i.e., using the same process parameters), experience shows that all remaining spring structures would assume a release tip height that is equal to that of the benchmark structure if these remaining spring structures were released without annealing. Accordingly, if the benchmark tip height is less than or greater than the target distance, then a suitable annealing schedule (i.e., pre-release annealing, post-release annealing, or both) is used to tune the tip height of the remaining spring structures to the target tip height. For example, if the benchmark tip height is less than the target tip height, then post-release annealing is utilized to increase the tip heights of the spring structures (i.e., after release) such that the final tip height (i.e., after the annealing process) is equal to the target tip height. Conversely, if the benchmark tip height is greater than the target tip height, then pre-release annealing is utilized to alter the internal structure (e.g., the stress gradient) of the remaining unreleased spring structures such that their release tip height is equal to or less than the selected target tip height (note that post-release annealing may then be performed after release to "fine tune" a tip height that is less than the selected target distance after release). In this manner, by releasing one or more benchmark structures from each production run (or limited number of runs) and determining the pre-release and/or post-release annealing processes needed to tune the remaining spring structures, a large number of spring structures that are formed over several production runs and have different release tip heights can all be corrected to the specified target tip height in a highly efficient manner.

According to another aspect of the present invention, the inventors have determined that the amount of tuning achieved during the pre-release and post-release annealing processes is related to the temperature at which the annealing takes place. For example, a released spring structure having a release tip height will bend a relatively small amount (thereby increasing the tip height by a relatively small distance) when subjected to post-release annealing at a relatively low annealing temperature, and will bend a relatively large amount (thereby increasing the tip height by a relatively large distance) when subjected to post-release annealing at a relatively high annealing temperature. Similarly, a relatively low pre-release annealing temperature will produce a relatively small amount of flattening (thereby decreasing the tip height by a relatively small amount), and a relatively high pre-release annealing temperature will produce a relatively large amount of flattening (thereby decreasing the tip height by a relatively large amount). Some spring structures are similarly tuned by the length of the applied annealing process (i.e., annealing at a selected temperature for a relatively short period produces a relatively small amount of tuning, and annealing at the selected temperature for a relatively long time period produces a relatively large amount of tuning). Therefore, in accordance with another embodiment of the present invention, an annealing schedule is prepared for each particular spring structure type (i.e. based on the spring material and the length of the spring structure), which is subsequently used to determine the annealing temperature and/or annealing time period required to tune each out-of-spec spring structure. For example, if first and second spring structures are fabricated in two different production runs and exhibit two different initial release heights that are both less than the selected target height, then the first spring structure would be post-release annealed at a first temperature determined from the associated annealing schedule, and the second spring structure would be post-release annealed at a second temperature determined from the associated annealing schedule. Note that the annealing schedule for each spring structure type may be determined from a predetermined annealing schedule that is based on prior experimentation involving that spring structure type, or may be calculated using other empirical data (e.g., predicted using experimental data from other spring structure types).

According to an aspect of the present invention, the annealing processes described above are performed at a temperature that is equal to or greater than the maximum temperature in which the finished spring structure will operate, thereby preventing undesirable post-production warping of the spring structures. In one embodiment, an annealing schedule is selected in which a final annealing process at the maximum temperature adjusts the tip height of a spring structure to the target tip height.

According to another embodiment of the present invention, the pre-release and post-release processes described above are used to generate annealing schedules that provide an inexpensive method for fabricating spring structures having different tip heights. This inexpensive method generally includes forming a cache of pre-fabricated, unreleased spring structures having a certain stress (or strain) gradient, and generating annealing schedules that can be used to tune the spring structures of the cache to different target tip heights. For example, a first annealing schedule may include pre-release annealing at a certain temperature to tune the spring structures such that they achieve a first, relatively low tip height. Similarly, a second annealing schedule may include post-release annealing at another temperature to tune the spring structures such that they achieve a second, relatively high tip height. In this manner, a set of annealing schedules may be provided as a "cookbook" that allows the flexible and cost-effective production of spring structures having a variety of specified tip heights from a single cache of spring structures. In addition, according to another embodiment, a fabrication entity may sell a cache of spring structures and annealing schedules to a downstream manufacturing entity, thereby allowing the downstream manufacturing entity to quickly and efficiently produce a variety of finished spring structures by annealing and releasing the spring structures according to the provided annealing schedules. Note that equipment (e.g., hot plates and lithography/masking chambers) needed to perform the annealing/release process is relatively inexpensive and typically uncomplicated, whereas forming the unreleased spring structures and establishing an annealing schedule requires relatively expensive equipment and substantially greater expertise.

According to another aspect of the present invention, various annealing methods are utilized to produce uniformly annealed springs, abruptly bending (non-circular) spring structures that are produced using localized annealing processes, and methods for forming differently shaped spring structures on a single wafer. Uniform annealing of all spring structures on a wafer is achieved using, for example, a hot plate or oven. Selective annealing of some spring structures formed on a substrate is achieved, for example, by applying a current through the selected spring structures, using a laser beam, or through the application of heat absorbing or heat reflecting materials on the spring material before annealing. Abruptly bending spring structures are generated by locally annealing selected regions of a spring at a relatively high temperature, while subjecting the remaining portions of the spring structure to relatively low annealing temperatures. Localized annealing is achieved, for example, using a laser beam pulse, or the selective application of heat absorbing or heat reflecting materials.

According to another embodiment of the present invention, the spring structure fabrication method is directed to spring structures formed using stress-engineered metal films having internal stress gradients that cause the released spring structures to bend away from the underlying substrate upon release. The present inventors have found through experimentation that the fabrication method disclosed herein produces suitable results in spring structures formed from stress-engineered Mo, MoCr, W, Ti:W, Ni, and NiZr films that are sputter deposited and etched according to known techniques. The present inventors have also found through experimentation that the fabrication method disclosed herein produces particularly beneficial results in spring structures formed from stress-engineered Ni, Cu, NiP, and NiB films that are formed by electroless plating or electroplating techniques. Note that spring structures are typically not produced using plating techniques because the release tip height (i.e., amount of spring curvature upon release) of such "plated" spring structures is typically found to be too small. The present inventors have determined that the tip height of plated spring structures can be reliably and significantly increased using the post-release annealing process described herein. Therefore, because spring structures fabricated by plating stress-engineered metal films onto a substrate is typically less expensive than production using sputtered films, the present invention greatly facilitates the production of low-cost spring structures.

According to yet another embodiment of the present invention, the spring structure fabrication method is directed to spring structures formed using films having internal strain (as opposed to stress) gradients. The present inventors have determined that a permanent change in the free (unloaded) bending radius of spring structures formed from such films can be induced during annealing by an internal structural change inside the film material. Such films may be fabricated such that a permanent volume or density change occurs in the material upon annealing. This permanent change occurs through the rearrangement of the atoms within the structure causing them to pack closer together or further apart. The mechanisms for the volume change can include a number of effects such as phase transformation, interdiffusion, precipitate formation, void collapse, intermetallic growth, etc., that can be incorporated into the thin film during deposition or plating, or during subsequent processing steps. Anneal-induced bending of spring structures formed by such films is accomplished by forming the strain gradient such that volume change during annealing is not symmetric (e.g., the uppermost regions are subject to a greater contraction than the lower regions). Note that in such strain-based spring structures there is no requirement that the film be formed with an initial stress profile.

BRIEF DESCRIPTION OF THE DRAWINGS

These and other features, aspects and advantages of the present invention will become better understood with regard to the following description, appended claims, and accompanying drawings, where:

FIGS. 2(A), 2(B), 2(C) and 2(D) are simplified cross sectional side views showing methods for forming spring films according to an embodiment of the present invention;

FIGS. 3(A) and 3(B) are simplified cross sectional side views showing methods for forming unreleased spring structures according to an embodiment of the present invention;

FIG. 4 is a top plan view showing two spring structures formed according to the method of FIGS. 3(A)–3(B);

FIG. 5 is a simplified cross sectional side view showing a method for releasing a benchmark spring structure according to an embodiment of the present invention;

FIG. 6 is a perspective view showing a released benchmark spring structure and an unreleased spring structure according to an embodiment of the present invention;

FIGS. 7(A) and 7(B) are simplified cross sectional side views showing methods for determining whether a pre-release or a post-release annealing process is implemented according to an embodiment of the present invention;

FIGS. 8(A) and 8(B) are simplified cross sectional side views showing a post-release annealing process according to an embodiment of the present invention;

FIG. 9 is a graph showing experimental data indicating the effect of different post-release annealing temperatures on adjusted tip heights;

FIG. 21 simplified cross sectional side view showing a localized annealing process utilizing a laser beam according to another embodiment of the present invention;

FIG. 22 is a photograph showing an exemplary spring structure produced using the method depicted in FIG. 21;

FIGS. 23(A) and 23(B) are simplified cross sectional side views showing exemplary AFM scanning probes produced in accordance with an embodiment of the present invention;

DETAILED DESCRIPTION OF THE DRAWINGS

As used herein, the phrase "tip height" refers to a distance between the tip of a spring structure and the substrate to which the spring structure is attached, and generally indicates the amount of curvature a spring structure has achieved. For example, when a spring structure has a minimal (i.e., relatively flat) curvature, then the tip height is typically relatively small. Conversely, when the curvature of the spring structure is relatively large (i.e., the spring structure is significantly curved away from the substrate), then the tip is positioned further from the substrate and the tip height is typically relatively large. Typically, a tip height is measured perpendicular to the substrate surface (i.e., the shortest distance between the substrate and the tip). However, those skilled in the art will recognize that tip heights can be measured using many different frames of reference and many different ways.

There are several specific tip height types that are referenced herein. First, a "release tip height" refers to the tip height assumed when the spring structure is initially released from the underlying substrate in the manner described herein. Next, a "benchmark tip height" refers to the release tip height of a particular reference, or "benchmark" spring structure that is used to determine the would-be release tip height of all remaining unreleased and non-annealed spring structures. The term "target tip height" refers to the desired (or ideal) tip height of subsequently produced spring structures, and is typically specified by a customer or other end-user. Lastly, the term "final tip height" refers to the tip height of the spring structures at the end of the production process (i.e., after annealing is completed). Note that the goal of the present invention is to "tune" spring structures such that their final tip height equals a particular target tip height.

Figure 1:
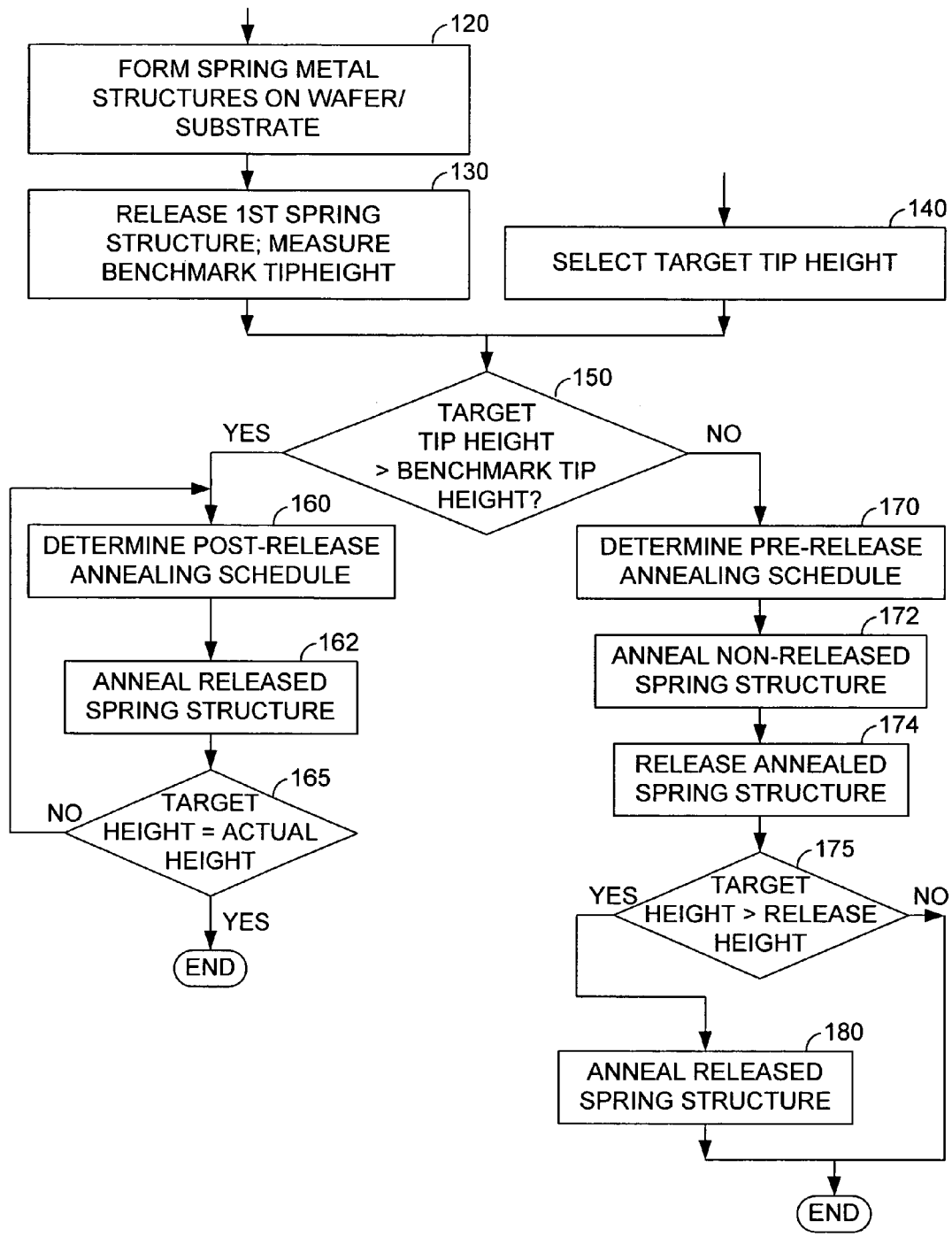
FIG. 1 is a flow diagram showing a method for fabricating spring structures according to an embodiment of the present invention.

FIG. 1 is a flow diagram showing a generalized method for producing spring structures according to an embodiment of the present invention.

Referring to the upper left corner of FIG. 1, the method begins by forming several unreleased spring structures on a substrate or wafer (block 120). Each spring structure is fabricated in the manner described below to include a spring finger (i.e., a ribbon of stress-engineered or strain-engineered film) having a first end, a second end including a tip, and a central section extending between the first and second ends. The term "unreleased" indicates that the spring finger is attached along its entire length to the underlying wafer/substrate. As described in detail below, the spring structures can have any of several compositions and be formed in several ways, provided the spring structures can be selectively released from the underlying substrate.

After forming the unreleased spring structures, a benchmark (first) spring structure is released to determine the benchmark tip height, which indicates the would-be release tip height of all spring structures fabricated during a particular production run (or portion of a production run). As described in more detail below, this release process involves detaching (e.g., under-etching) the central section and second end of the benchmark spring structure's spring finger while maintaining the connection of the first end (anchor portion) to the underlying substrate, thereby forming a cantilever-like arrangement in which the central section and second end are separated from the substrate (see FIG. 6, which shows a released spring structure 200-1 next to an unreleased spring structure 200-2). The release (or benchmark) tip height of the benchmark spring structure (e.g., distance $H_0$ in FIG. 6) is the perpendicular distance from an upper surface of the substrate to the tip of the benchmark spring structure following the release procedure. Note that, when the spring finger is formed with a significant internal stress gradient, the releasing process may cause the central section of the released benchmark spring structure to bend away from the substrate.

Referring to the right side of FIG. 1, a target tip height is selected (block 140) by, for example, an end user either before or after the spring structure formation and benchmark release process. That is, the target tip height may be selected independent of the spring structure fabrication process. As described in additional detail below, because the tip height of each spring structure can be tuned (adjusted) to alter its release and/or final tip height such that it matches the target tip height, the selection of the target tip height can be performed substantially independent of the fabrication process. It is noted, however, that the target tip height must be within a range achievable by the particular spring structure (e.g., a spring structure typically cannot achieve a tip height that is longer than its unreleased length).

According to the present invention, a determination is then made (block 150) as to whether the benchmark tip height (generated in block 130) is greater than or less than the target tip height (generated in block 140). This determination is performed, for example, by measuring the benchmark tip height using known methods, and comparing the measured tip height with the target tip height.

Referring to the left side of FIG. 1, if the target tip height is greater than the benchmark tip height (YES in block 150), then a post-release annealing temperature is determined based on a difference between the benchmark tip height and the target tip height (block 160), and a post-release annealing process is performed (block 162) at the determined post-release annealing temperature (schedule) to increase the tip height until the (actual) tip height equals the selected target tip height (block 165). If the actual tip height is still less than the target tip height after an initial post-release annealing phase (NO in block 165), then one or more additional post-release annealing phases may be utilized (e.g., at a higher annealing temperature, as discussed below) until the actual tip height equals the target tip height (YES in block 165). By systematically increasing the tip height of all of the spring structures using a post-release annealing process, the tip heights can be reliably adjusted to the selected target tip height, thereby preventing the undesirable disposal of spring structures whose initial release tip height is less than the target tip height, as required under conventional methods.

Referring to the right side of FIG. 1, if the target tip height is less than the release tip height (NO in block 150), then a pre-release annealing schedule is selected (block 170) and one or more unreleased spring structures are subjected to a pre-release annealing temperature (process) according to the determined annealing schedule (block 172), thereby altering the spring structures such that, when subsequently released (block 174), the release tip height of these spring structures is less than or equal to the target tip height. By systematically decreasing the release tip height of all of the spring structures using a pre-release annealing process, the tip heights can be reliably adjusted to the target tip height, thereby preventing the undesirable disposal of spring structures whose initial release tip height is greater than the target tip height, as required under conventional methods. One or more optional post-release anneal processes may then be utilized to "fine tune" the tip heights when the actual tip height is less than the target tip height (blocks 175 and 180).

The generalized process depicted in FIG. 1 will now be described in additional detail with reference to FIGS. 2(A) through 16(B).

As set forth in the following paragraphs, several possible methods may be used to form spring structures (block 120 of FIG. 1). Exemplary embodiments are set forth below.

A first type of spring structure is formed from a stress-engineered film that is sputtered or plated over an underlying wafer/substrate. As set forth in detail below, stress-engineered films are characterized in that they have an intentionally-induced stress gradient that cause the resulting spring structures to bend relative to the substrate upon release.

FIGS. 2(A) through 2(C) are cross-sectional side views showing the formation of an exemplary stress-engineered spring film over a substrate 201 according to an embodiment of the present invention.

Referring to FIG. 2(A), substrate 201 is formed from a selected substrate material (e.g., glass, quartz, silicon (Si), sapphire, aluminum oxide, or a suitable plastic). An optional conductive region 205 may be formed in substrate 201 using known techniques to facilitate subsequent electroplating and/or electrical connection to the subsequently formed spring structure.

Also shown in FIG. 2(A) is an optional release (sacrificial) layer 210, which is deposited onto an upper surface 202 of substrate 201 prior to formation of the spring film (discussed below). The purpose of release layer 210 is to facilitate a selective etching process that releases portions of the spring film from substrate 201 to form curved spring structures. As described below, the material utilized to form release layer 210 is selected such that substrate 201 and the spring structures are not significantly damaged (e.g., etched) during the release process (i.e., the selective under-etching of the spring structure in the manner described below), and an "anchor" portion of each spring structure remains connected to substrate 201 via a portion of release layer 210 after the release process is completed. In these embodiments, release layer 210 is matched with the subsequently formed spring film material such that the spring material adheres to the release material. Suitable release materials include, for example, one or more of Si, a silicon nitride composition (SiNx), a silicon oxide composition (SiOx), or titanium (Ti) that is deposited onto substrate 201 using known techniques. In an alternative embodiment (not shown), a separate anchor pad is formed adjacent to the release material that is not removed during the selective etch, and serves to connect the spring probe to wafer/substrate 210. In yet another alternative embodiment, substrate 201 may itself be used as a release layer, (i.e., release film 210 is not formed on substrate 201, and the spring film is formed directly on substrate 201) and the release process involves selectively etching into the upper surface 202 of substrate 201 to release the spring structures.

Referring to FIGS. 2(B) and 2(C), spring film 220 is then formed (e.g., sputtered or plated) in a controlled manner such that lowermost portions 220L (i.e., the film material located closest to release material layer 210) has a higher internal compressive stress than uppermost portions 220U (i.e., the film material located furthest to release material layer 210), thereby forming internal stress variations in the growth direction (e.g., stress gradient $\Delta\sigma+$, which increases in the direction perpendicular to the upper surface of substrate 201, as indicated in FIG. 2(C)). The thickness of spring film 220 is determined in part by the selected spring material, formation technique, desired spring constant, and shape of the final spring structure.

Sputter-based methods for forming spring film 220 such that it has a suitable stress gradient $\Delta\sigma+$ (see FIG. 2(C)) are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring material film 220 includes one or more metals suitable for forming a spring structure (e.g., one or more of molybdenum (Mo), a "moly-chrome" alloy (MoCr), tungsten (W), a titanium-tungsten alloy (Ti:W), chromium (Cr), nickel (Ni) and a nickel-zirconium alloy (NiZr)).

According to another embodiment, a spring film 220 (e.g. Ni, Cu, alloys) is deposited onto a seedlayer (e.g. Au, Ni) using electroplating or electroless plating techniques. Similar to the sputtered embodiment described above, in one embodiment the process parameters are changed during plating to generate a suitable stress gradient $\Delta\sigma+$, although it is possible to form a suitable film without changing the process parameters. According to an aspect of the present embodiment, a plating chemistry is used that deposits at least two elements into the film that can subsequently be transformed to an intermetallic phase using, for example, the annealing processes described herein to bend the resulting spring structure such that its tip is positioned at the target distance away from the underlying substrate surface. In one specific embodiment, an Au seed layer is lithographically patterned and then sequentially exposed to an $Ni_3P$ (first) solution, which forms a relatively compressive lower spring layer portion on the release layer, and then an $Ni_3B$ (second) solution, which forms a relatively tensile upper spring layer portion on the lower spring layer portion. The total thickness of the Ni-based spring film layer is in the range of 0.5 to 5.0 microns. Other plated spring types may include Cu with various hardening materials added thereto that are formed using either electroless plating or electroplating. The Cu plating process is performed such that a stress-gradient is formed in the plated material in the plating direction (i.e., similar to that described above for the sputtered embodiments) by, for example, either varying a parameter during the plating process (e.g. changing current density while plating), or using two different plating baths with different stress characteristics. In yet another alternative embodiment, the plating may be performed using electroplating techniques (i.e., after depositing a suitable seed material (e.g., Au; not shown) onto the upper surface of the release material). Note that release layer 210 must be a conductive material, such as Ti, in order for electroplating to be performed. Note also that the plated material may be formed as a continuous layer and then etched as described below to form individual spring structures, or individual spring structures 220 may be formed directly by plating through a hard mask (e.g., resist) 240, as indicated in FIG. 2(D).

When the continuous film approach (discussed above) is utilized, the sputtered or plated stress-engineered film must be etched to form unreleased spring structures (i.e., spring fingers, sometimes referred to as "islands" prior to release). FIGS. 3(A) and 3(B) are cross-sectional side views illustrating the etching process according to an embodiment of the present invention. As indicated in FIG. 3(A) this etching process typically employs elongated spring masks 310 (e.g., photoresist) that are patterned over selected portions of spring material film 220. Next, as indicated in FIG. 3(B), exposed portions of spring material film 220 and release layer 210 surrounding spring mask 310 are etched away using one or more etchants 320 to form separated spring fingers (e.g., structures 220-1 and 220-2, shown in top view in FIG. 4). This etching process is performed using, for example, a wet etching process, anisotropic dry etching, or physical ion etching methods, such as Argon ion milling. In yet another possible embodiment, the etching process can be performed using the electrochemical etching process described in IBM J. Res. Dev. Vol. 42, No. 5, page 655 (Sep. 5, 1998), which is incorporated herein by reference. Many additional process variations and material substitutions are therefore possible and the examples given are not intended to be limiting.

As indicated in FIGS. 3(B) and 4, upon completion of the etching process (or upon removing the hard mask material when the approach shown in FIG. 2(D) is used), each elongated spring finger (e.g., spring finger 220-1) has a first end 220-1A, a second end 220-1B, and a central section 220-1C extending between first end 220-1A and second end 220-1B. Note that at this stage of the fabrication process, all of the spring structures are in an "unreleased" state in that their respective spring fingers remain attached to substrate 201 along their entire length (e.g., such that first end 220-1A, second end 220-1B and central section 220-1C are attached to substrate 201). Note also that in the embodiment shown in FIG. 3(B), each spring finger is attached to substrate 201 by way of a corresponding release material structure (i.e., such that first end 220-1A is attached by way of underlying section 210-1A of release material structure 210-1, and second end 220-1B is attached by way of release material section 210-1B).

The next stage of the novel method shown in FIG. 1 involves releasing a benchmark (first) spring structure, which is then used to determine the benchmark tip height, which represents the anticipated release tip height of all spring structures produced by the previous stages of the fabrication process (i.e., if released without annealing).

As indicated in FIG. 5, in one embodiment the benchmark release process involves forming a release mask 510 on first portion 220-1A of selected spring finger 220-1, which also masks the underlying section 210-1A of release material structure 210-1 (note that mask 510 extends over all other spring structures that are to remain unreleased). Release mask 510 defines a release window that exposes second portion 220-1B and central portion 220-1C of spring finger 220-1 and surrounding portions release material layer 210-1 (e.g., section 210-1A). Release mask 510 may also serve as a strapping structure to further secure first portion 220-1A to wafer 201. In one embodiment, release mask 510 is formed using photoresist. In other embodiments, a suitable metal or epoxy may be used. In yet another embodiment, no release mask is used, but the size (e.g., width) of the anchor (fixed) portion of the spring probe is larger than a width of the free portion (or free portion is perforated), and hence the release etching can be timed and stopped when the free portion releases from the underlying substrate (whereby the fixed (anchor) portion is only partially underetched, and remains attached to the substrate). A release etchant 520 (e.g., a buffered oxide etch) is then use to selectively remove a portion of the release material layer from beneath the exposed portion of the spring structure. As indicated in FIG. 6, removal of the exposed release material separates first (free) portion section 220-1B and central portion. 210-1C from substrate 201, thereby causing these portions to bend away from wafer 201 due to the internal stress variations established during the formation of the spring film (discussed above). Note that fixed (second) portion 220-1A remains secured to substrate 201 by release material (support) portion 210-1A, which is protected by release mask 510. Note also that resist mask 510 may be optionally removed from fixed end 220-1A of spring probe 220-1 after release.

The selected benchmark release process described above may include releasing only a single spring structure, or may include releasing multiple spring structures. For example, FIG. 6 is a perspective view showing released "benchmark" spring structure 200-1 next to non-released spring structure 200-2. Spring structure 200-2 is prevented from being released during the benchmark release process, for example, by entirely covering the structure with the release mask material. In another embodiment, all spring structures formed on a first wafer may be released, and the benchmark values utilized as described below to control the tip heights of spring structures fabricated on a second wafer (assuming the second wafer is fabricated either simultaneously with the first wafer, or at substantially the same time such that parameter drift is essentially non-existent). In yet another embodiment (e.g., where the spring structures is intentionally fabricated such that their release tip height is lower than the target tip height), it is not necessary to retain some spring structures are retained in an unreleased state.

As indicated in FIG. 6, according to another aspect of the present invention, the benchmark tip height $H_0$ of benchmark spring structure 200-1 is then measured and compared with the target tip height to determine the annealing process utilized on the remaining unreleased spring structures. In one embodiment, benchmark tip height $H_0$ is measured from the upper surface 202 of substrate 201 to a tip 220-T located on free end 220-1B of spring finger 220-1. Note that benchmark tip height $H_0$ indicates the amount of internal stress present in the spring film after film formation, and in conventional methods represents the final spring structure tip height. As set forth below, the present inventors discovered that the final tip height of the remaining spring structures can be altered from the benchmark tip height $H_0$ by annealing to "tune" (increase or decrease) the tip height of these remaining spring structures above or below this initial "benchmark".

As indicated on the upper right side of FIG. 1, according to an embodiment of the present invention, a target tip height is selected substantially independently of the spring structure fabrication process (block 140). As described in additional detail below, because the tip height of each spring structure can be tuned (adjusted) from its initial release tip height (i.e., measured from the benchmark spring structure) to a desired target tip height, the selection of the target tip height can be performed substantially independent of the fabrication process. In an alternative embodiment, the target tip height and fabrication process may be related to facilitate a particular annealing process. For example, given a target tip height $H_T$, the spring film formation process may be controlled to generate a benchmark tip height $H_0$ such that $H_T > H_O$, thereby allowing the tuning process to be limited to post-release annealing (i.e., obviating the need for pre-release annealing).

Referring again to FIG. 1, given the initial benchmark tip height $H_0$ and the selected target tip height, a determination is then made (block 150) as to whether pre-release annealing or post-release annealing is needed to "tune" the remaining spring structures.

FIGS. 7(A) and 7(B) are cross-sectional side views showing benchmark spring structure 200-1 and imaginary target spring structures 400-T1 and 400-T2, respectively (the imaginary target structures are indicated with dashed lines), which illustrate the determination process associated with block 150 of the flow diagram shown in FIG. 1. As mentioned above, benchmark spring structure 200-1 has a benchmark tip height $H_0$, which can be characterized as the shortest distance between tip 220-T and upper surface 202 of substrate 201. Referring to FIG. 7(A), target (or desired) spring structure 400-T1 indicates a target tip height $H_{T1}$ that is above (greater than) benchmark tip height $H_0$, which indicates that post-release annealing is required to increase the tip height of benchmark spring structure 200-1 (and the remaining spring structures produced with benchmark spring structure 200-1) to equal target tip height $H_{T1}$. Conversely, as shown in FIG. 7(B), target (or desired) spring structure 400-T2 indicates a target tip height $H_{T2}$ that is below (less than) benchmark tip height $H_0$, which indicates that pre-release annealing of the remaining spring structures is required to decrease their respective tip heights to equal target tip height $H_{T2}$.

FIGS. 8(A) and 8(B) are cross-sectional side views showing post-release annealing performed using a hot plate 810 according to a specific embodiment of the present invention. FIG. 8(A) depicts a first post-release annealing process in which benchmark spring structure 200-1 is "tuned" from its benchmark tip height $H_0$ to a first target tip height $H_{T1}$, and FIG. 8(B) depicts a second post-release annealing process in which benchmark spring structure 200-1 is "tuned" from its benchmark tip height $H_0$ to a second target tip height $H_{T2}$. Note that, as discussed in additional detail below, the post-release annealing process is not limited to the use of hot plate 810, and maybe performed using any suitable equipment.

In accordance with an aspect of the present embodiment, post-release annealing is performed at a post-release annealing temperature that is greater than the highest temperature reached during production (i.e., film formation, structure definition, and release). For example, if the highest temperature reached during formation and release of the spring finger is less than 100° C., then the annealing temperature is greater than 100° C. For example, FIG. 8(A) shows benchmark spring structure 200-1(t0) (i.e., benchmark spring structure 200-1 at time t0) in dashed lines prior to annealing, and benchmark spring structure 200-1(t1) in solid lines after annealing (i.e., at a time t1). Assuming the post-release annealing temperature (e.g., 200° C.) at which hot plate 810 is maintained is greater than the highest fabrication temperature (e.g., 120° C.), then benchmark spring structure 200-1 will bend from the initial shape indicated in dashed lines (i.e., structure 200-1(t0)) to the final shape indicated in solid lines (i.e., structure 200-1(t1)), thereby increasing the tip height from benchmark tip height $H_0$ to target tip height $H_{T1}$.

In according with another aspect of the present invention, the amount of bending (i.e., increase in tip height) is directly related to the post-release annealing temperature (assuming a constant spring length). As described above, FIG. 8(A) depicts bending of benchmark spring structure 200-1 due to post-release annealing at a relatively low (first) temperature (e.g., 200° C.). FIG. 8(B) again shows benchmark spring structure 200-1(t0) (before annealing) in dashed lines, and benchmark spring structure 200-1(t2) in solid lines at a time t2 after annealing at a relatively high (second) temperature (e.g., 300° C.). As indicated in FIG. 8(B), post-release annealing at the second (relatively high) temperature causes benchmark spring structure 200-1 to bend from the initial shape to the final shape indicated in solid lines (i.e., structure 200-1(t2)), thereby increasing the tip height from benchmark tip height HO to target tip height $H_{T2}$ that is greater than target tip height $H_{T1}$.

FIG. 9 is a graph indicating experimental data generated for spring structures having various spring lengths. As indicated by the data, the tip height of each spring is directly proportional to the annealing temperature. Note that experimental data was generated up to 300° C. due to heat generating limitations of the hot plate used during experimentation, and that the inventors believe further increases in tip heights can be achieved using a post-release annealing temperature above 300° C.

Note that although FIGS. 8(A) and 8(B) depict post-release annealing as applied to benchmark spring structure 200-1, the depicted post-release annealing process is also applicable to the remaining spring structures (e.g., spring structure 200-2; see FIG. 6) that have the same structural characteristics (e.g., fabricated in the same batch, and have the same spring length) as that of benchmark spring structure 200-1. That is, the remaining spring structures are first released such that each spring structure achieves a release tip height that is essentially identical to the benchmark release height, and then annealed at the appropriate post-release annealing temperature such that their tip heights are adjusted to the target tip height in the manner shown in FIGS. 8(A) and 8(B).

Referring back to FIG. 7(B), pre-release annealing is required to decrease the tip heights of the remaining spring structures (e.g., spring structure 200-2; see FIG. 6) when target spring structure 400-T2 has a target tip height $H_{T2}$ that is below (less than) benchmark tip height $H_0$.

Figure 10A:
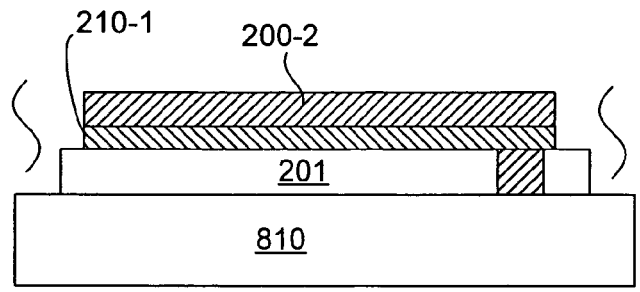
FIGS. 10(A), 10(B) and 10(C) are simplified cross sectional side views showing a pre-release annealing process and subsequent release process according to an embodiment of the present invention.
Figure 10B:
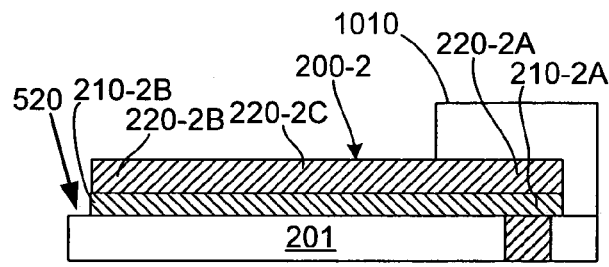
Figure 10C:
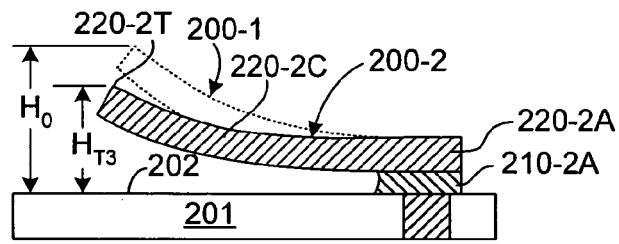

FIG. 10(A) is a cross-sectional side view showing pre-release annealing performed using hot plate 810 according to another specific embodiment of the present invention. FIG. 10(A) depicts a pre-release annealing process in which spring structure 200-2 is "tuned" by annealing at a selected pre-release annealing temperature before spring finger 220-2 is released from substrate 201. As indicated in FIG. 10(B), a release mask 1010 is then formed over a first (anchor) end portion 220-2A of on the annealed spring finger 220-2 in the manner described above, and then an etchant 520 is used to release a second (free) end portion 220-2B and central section 220-2C. The released spring structure 200-2 is shown in FIG. 10(C), where first end portion 220-2A is attached to substrate 201 via release material portion 210-2A, central section 220-2C curves away from substrate 201, and a tip 220-2T is located a release tip height $H_{T3}$ from upper surface 202 of substrate 201. Although the physical mechanism behind the reduction in tip height caused by the pre-release annealing process is not fully understood, experiments by the present inventors indicated that the observed changes are due to annealing the stress partially out of the metal stack. As with post-release annealing, pre-release annealing is not limited to the use of hot plate 810. FIG. 10(C) also indicates the flattening effect on spring structure 200-2 by the pre-release annealing. That is, if pre-release annealing were not performed at a suitable temperature, then the release tip height of spring structure 200-2 would equal the benchmark tip height $H_0$ of benchmark spring structure 200-1 (shown in dashed lines).

Similar to post-release annealing (discussed above), pre-release annealing is performed at an annealing temperature that is greater than the highest temperature reached during fabrication. For example, if the highest temperature reached during deposition of the spring film is 100° C., then the annealing temperature is greater than 100° C. In addition, the amount of flattening (i.e., decrease in tip height) is directly related to the pre-release annealing temperature.

Figure 11:
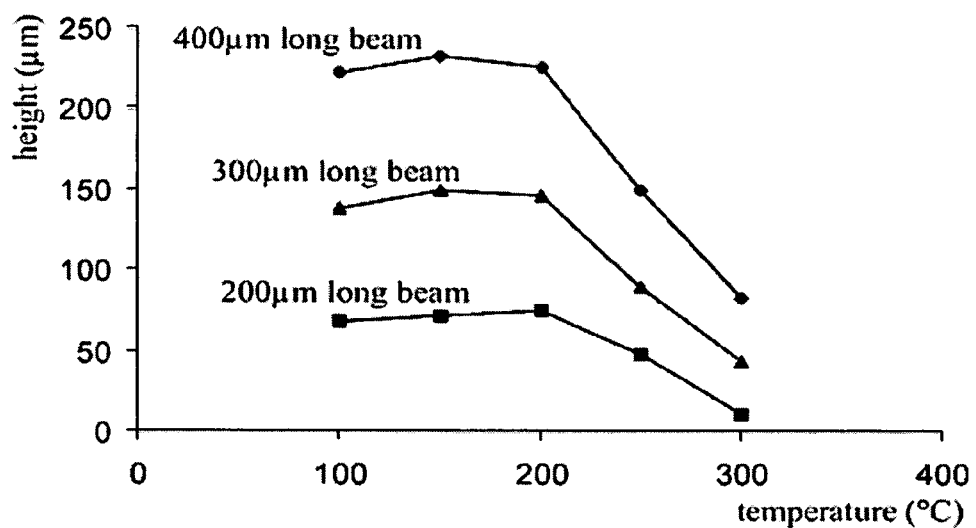
FIG. 11 is a graph showing experimental data indicating the effect of different pre-release annealing temperatures on adjusted tip heights.

FIG. 11 is a graph indicating experimental data generated for spring structures having various spring lengths. As indicated by the data, the tip height of each spring is indirectly proportional to the annealing temperature. Note that significant reduction in the metal (i.e., NiZr) spring structure tip heights begins at approximately 200° C. The inventors believe further flattening may be achieved using a post-release annealing temperature above 300° C.

Referring again to lower right portion of FIG. 1, after pre-release annealing and subsequent release, if the release tip height of a spring structure is less than the target tip height (NO in decision block 175), the present inventors have found that a supplemental post-release annealing process (block 180) may be performed to increase the tip height in some cases.

Figure 12:
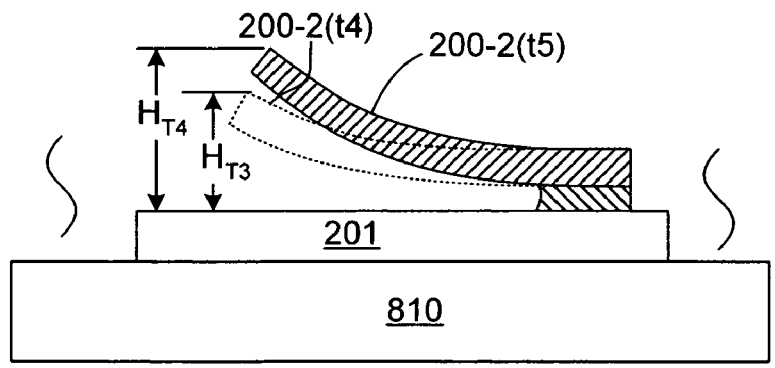
FIG. 12 is a simplified cross sectional side view showing a post-release annealing process applied to the spring structure of FIG. 10(C) according to another embodiment of the present invention.

FIG. 12 is a cross-sectional side view showing post-release annealing performed using hot plate 810 according to another embodiment of the present invention. In particular, FIG. 12 depicts post-release annealing of spring structure 200-2(t4) at a time t4 (shown in dashed lines) which results in "tuned" spring structure 200-2(t5) at a subsequent time t5 (shown in solid lines), indicating an increase in the tip height from an initial release tip height $H_{T3}$ to a target tip height $H_{T4}$. Note that time t4 occurs after the pre-release annealing and subsequent release described above with reference to FIGS. 10(A) through 10(C).

In accordance with another aspect of the present embodiment, the post-release annealing process depicted in FIG. 12 (i.e., after a pre-release annealing process) is performed at an annealing temperature that is greater than the highest temperature reached during fabrication, and is also greater than the pre-release annealing temperature. For example, if the highest temperature reached during either deposition of the spring film or pre-release annealing of spring structure 200-2 prior to time t4 is 200° C., then the post-release annealing temperature is greater than 200° C.

Figure 13:
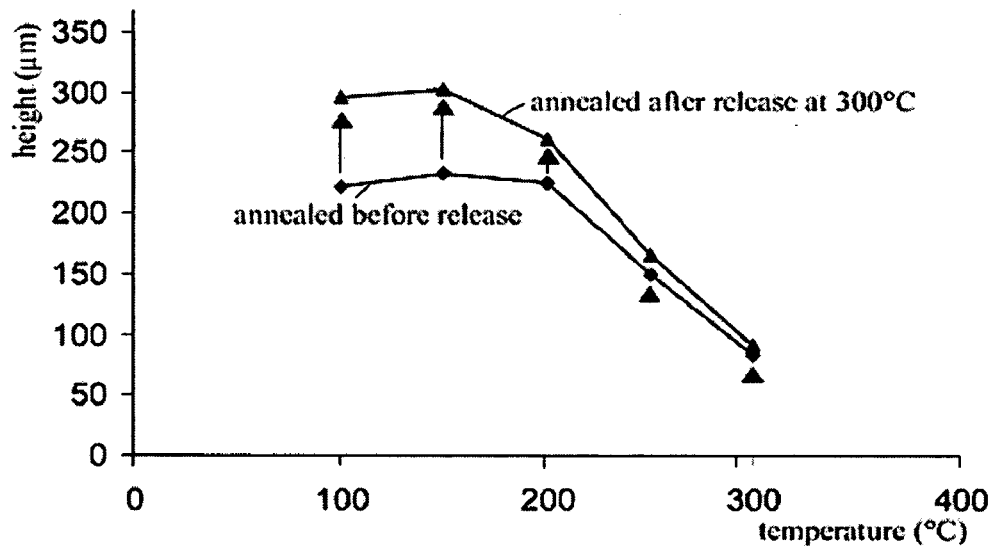
FIG. 13 is a graph showing experimental data indicating the effect on adjusted tip heights of different pre-release annealing temperatures combined with a fixed post-release annealing temperature.

In according with another aspect of the present invention, the amount of bending (i.e., increase in tip height) is directly related to a difference between the pre-release and post-release annealing temperature. FIG. 13 is a graph indicating experimental data generated for substantially identical spring structures that are subjected to various pre-release annealing processes ranging from approximately 100° C., and then to a post-release annealing process at 300° C. As indicated by the data, the increase in tip height of each spring is directly proportional to the difference between the pre-release and post-release annealing temperatures. Note that the tip height increase is greatest when pre-release annealing was performed at approximately 100° C., followed by post-release annealing at 300° C., and that little or no increase occurs when pre-release and post-release annealing occur at the same temperature (e.g., 300° C.).

According to another aspect of the present invention, undesired tip height changes, which are caused by exposure of spring structures to high temperatures during their product lifetimes, are prevented by subjecting the spring structures during the annealing process to a temperature that is higher than or equal to the maximum operating temperature in which the spring structure will ultimately operate. Spring structures, such as those formed using the methods described above, can experience changes in tip height when operated in certain high-temperature settings. The present inventors have observed that such tip height changes typically occur when the spring structure is subjected to a temperature that is greater than the highest temperature experienced during fabrication (i.e., in effect, unintentional post-release annealing). For example, a spring structure subjected to a maximum temperature of 100° C. during fabrication/annealing will typically warp if subjected to a temperature of 200° C. during subsequent operation, thereby altering the tip height. Conversely, when the spring structure is subjected to an annealing process at 200° C. or higher during fabrication, subsequent operation at 200° C. will not produce a corresponding change to the tip height.

Figure 14:
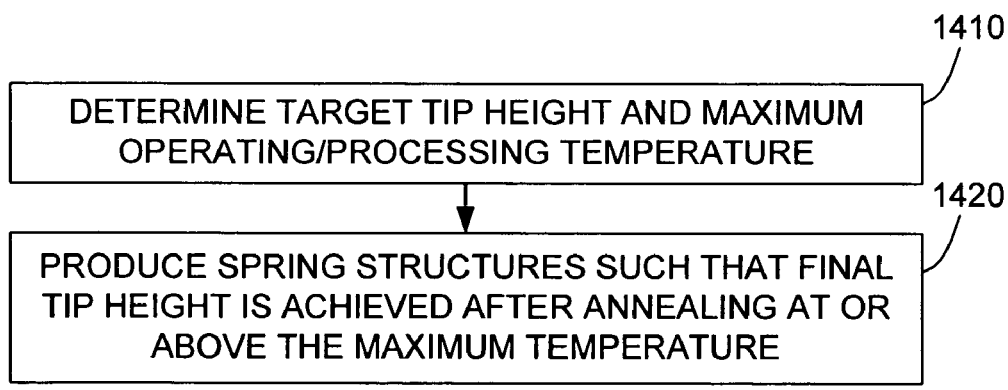
FIG. 14 is a flow diagram indicating method for producing spring structures that resist post-production warping according to another embodiment of the present invention.

FIG. 14 is a flow diagram showing a generalized spring structure production process according to another embodiment of the present invention that resists undesirable post-production warping resulting from high operating temperatures or high post-release processing temperatures. During the target tip height selection phase (see block 140, discussed above), in addition to other spring structure specifications, a maximum temperature (i.e., the maximum predicted temperature that the spring structure will be subjected to during processing or operation) is determined for the subsequently produced spring structures (block 1410). The maximum operating temperature may represent a high temperature setting in which the spring structures are intended to be used. The maximum processing temperature may involve the formation of tip structures (e.g., carbon nanotubes grown at approximately 700° C.) or coatings (e.g., diamond layers deposited at approximately 900° C.). This maximum temperature is then utilized to define the subsequent production process such that at least one annealing process is used to temper the spring structure to resist undesired warping at the maximum temperature (block 1420). For example, a final annealing process (i.e., pre-release annealing and/or post-release annealing) may be performed at or above the predetermined maximum operating temperature. More specifically, referring back to the example shown in FIGS. 10(A) through 10(C) and 12, a production/annealing schedule may be selected that includes pre-release annealing, which occurs at a first temperature below the maximum operating temperature, followed by post-release annealing at the maximum operating temperature. The resulting "tempered" spring structures have the specified target tip height, and due to the post-release annealing at the maximum temperature, are resistant to warping when subsequently subjected to the maximum temperature.

FIGS. 15 and 16(A) through 16(C) depict an inexpensive method for fabricating spring structures according to another embodiment of the present invention.

Figure 15:
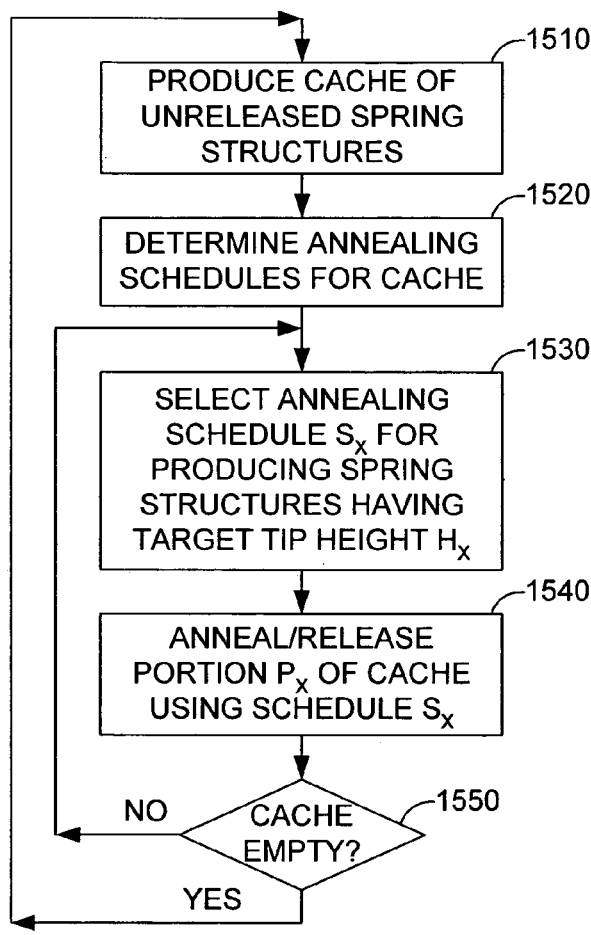
FIG. 15 is a flow diagram showing a low-cost method for mass-producing spring structures according to another embodiment of the present invention.
Figure 16A:
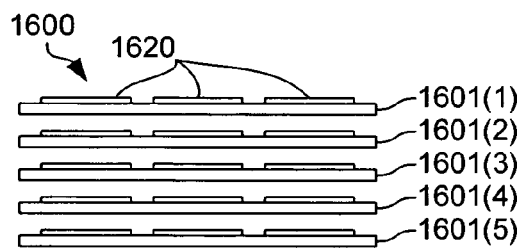
FIGS. 16(A), 16(B) and 16(C) are simplified side views illustrating the method of FIG. 15.

Referring to block 1510 located at the upper portion of FIG. 15, the method begins by generating a cache (i.e., large quantity) of pre-fabricated, unreleased spring structures, where each spring structure of the cache has a commonly shared stress or strain gradient (i.e., such that, if released without annealing or other treatment, all of the spring structures would have the same release tip height). FIG. 16(A) depicts an example of a cache 1600 including several wafers (substrates) 1601(1) through 1601(5), each wafer including one or more unreleased spring fingers 1620 having a certain stress or strain gradient.

Referring back to FIG. 15, a set of annealing schedules is prepared for the cache (block 1520) using, for example, the benchmark process described above. In one specific embodiment, the set of annealing schedules indicate two or more specific annealing schedules that, if followed during the annealing release process, result in released spring structures having associated target tip heights. For example, the set may include a first annealing schedule that would cause a particular spring structure of cache 1600 to achieve a first, relatively small tip height, and a second annealing schedule that would cause the particular spring structure to achieve a second, relatively large tip height. Note that large numbers of unreleased spring structures generated during a particular production run may be categorized into two or more separate caches if different annealing schedules are required.

Figure 16B:
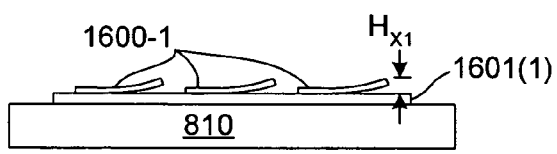

After generating a cache and associated set of annealing schedules, the cache may then be used to generate spring structures having target tip heights using the methods described above. In particular, given a selected target tip height $H_X$, an associated annealing schedule $S_X$ is selected from the anneal schedule set (block 1530). Next, a portion $P_X$ of the cache (i.e., some or all of the unreleased spring structures, depending on the number of released spring structures required) is annealed/released according to annealing schedule $S_X$, thereby causing the unreleased spring structures of cache portion $P_X$ to become released spring structures having target tip height $H_X$ (block 1540). For example, FIG. 16(B) shows substrate 1601(1), which represents a first portion of cache 1600 (FIG. 16(A)), being treated using a first annealing schedule (e.g., post-release annealing at a first, relatively low temperature using hot plate 810), thereby forming spring structures 1600-1 having target tip heights $H_{X1}$.

Figure 16C:
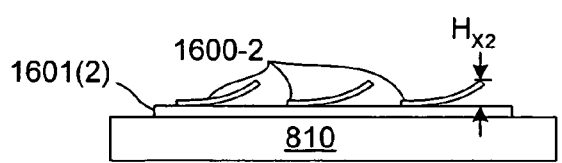

Referring back to FIG. 15, after generating a set of released spring structures, if the cache still contains unreleased spring structures (NO in block 1550), then the processes associated with blocks 1530 and 1540 may be repeated using another portion of the cache to produce a second set of spring structures having a second target tip height. For example, FIG. 16(C) shows substrate 1601(2), which represents a second portion of cache 1600 (FIG. 16(A)), being treated using a second annealing schedule (e.g., post-release annealing at a second, relatively high temperature using hot plate 810), thereby forming spring structures 1600-2 having target tip heights $H_{X2}$.

The method depicted in FIG. 15 facilitates greatly reduced fabrication costs by minimizing the amount of fabricating time associated with the production of spring structures, and minimizing waste (i.e., maximizing production yield). Further, the fabrication and anneal/release portions of the method can be performed in the same or separate locations. For example, in one embodiment, both the fabrication and release/anneal portions of the method are performed by the manufacturing entity (i.e., the entity that fabricates the spring structures, sorts spring structures into caches, and/or generates the set of annealing schedules for a particular cache). In this embodiment, customers submit requests for finished (i.e., released) spring structures that meet certain specifications (e.g., having a specified target tip height), and the manufacturing entity generates the finished spring structures using previously cached unreleased structures. In an alternative embodiment, the fabrication and release/anneal portions of the method are performed separately by the fabricating entity and a release/anneal entity. In this alternative embodiment, the fabricating entity produces the cache of unreleased spring structures, and passes the cache to the release/anneal entity. In one specific embodiment, the set of annealing schedules is determined by the fabricating entity, and in another specific embodiment the annealing schedules are determined by the release/anneal entity. The release/anneal entity then generates the finished (released) spring structures and, in some instances, incorporates the spring structures into final products. By separating the fabrication and release/anneal operations such that they are performed by two entities, the alternative embodiment allows companies without sputtering or plating facilities and associated expertise to quickly generate spring structures meeting a wide range of specifications.

Although the present invention is described above with reference to certain specific embodiments, several alternative embodiments are also possible, some of which are set forth in the following paragraphs.

Figure 17:
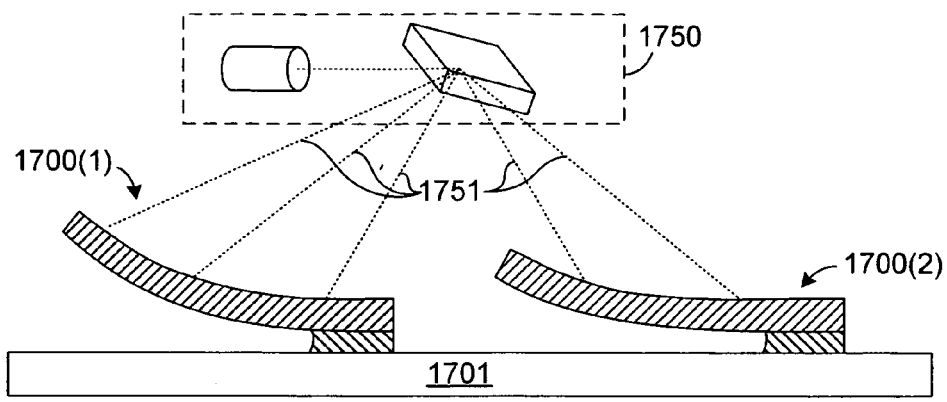
FIG. 17 is a simplified cross sectional side view showing a post-release annealing process utilizing a laser system according to another embodiment of the present invention.
Figure 18:
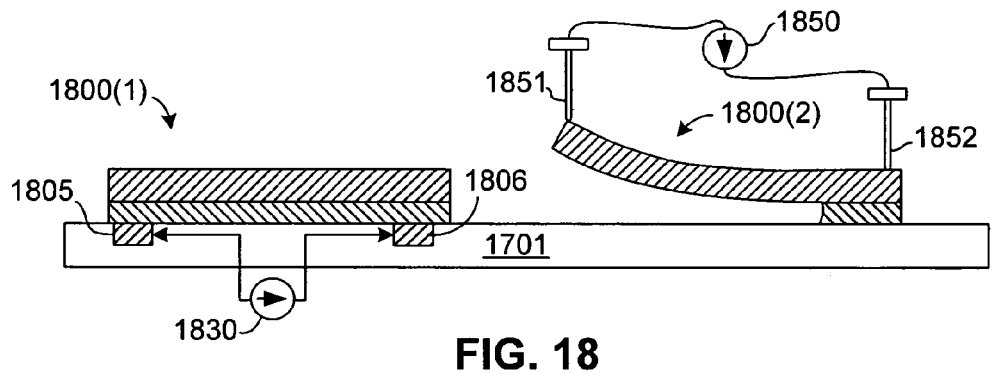
FIG. 18 is a simplified cross sectional side view showing annealing processes utilizing an applied current according to another embodiment of the present invention.

As discussed above, the annealing techniques utilized in accordance with the present invention are not restricted to the use of hot plates, as any suitable annealing equipment (e.g., ovens) may also be utilized. For example, FIG. 17 depicts an alternative annealing method according to another embodiment of the present invention wherein two spring structures 1700(1) and 1700(2) formed on a substrate 1701 are annealed using a laser beam 1751 that is generated and applied by a laser system 1750 such that each spring structure is uniformly annealed (i.e., subjected to substantially uniform temperatures along their entire length). According to an aspect of the current embodiment, laser beam 1751 can be controlled by known techniques to apply different annealing temperatures to spring structures formed on the same substrate, which is typically not possible or impractical using the hot plate method described above. For example, as depicted in FIG. 17, laser beam 1751 applies a relatively high annealing temperature onto spring structure 1700(1) than that applied to spring structure 1700(2), for example by directing laser beam 1751 onto spring structure 1700(1) for a relatively long period of time, and by directing laser beam 1751 onto spring structure 1700(2) for a relatively short period of time. Alternatively, the intensity (i.e., energy) of laser beam 1751 may be greater during the annealing process applied to 1700(1) than the intensity of laser beam 1751 applied to spring structure 1700(2). As depicted in FIG. 17, the resulting different annealing temperatures produce a greater bending of 1700(1) than that of spring structure 1700(2). Thus, by utilizing the localized annealing process depicted in FIG. 17, spring structures having different tip heights can be easily and conveniently formed next to each other.

Figure 19A:
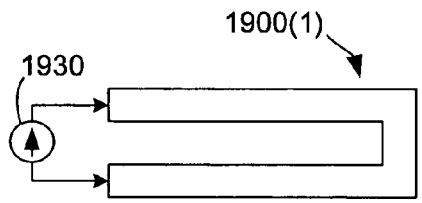
FIGS. 19(A) and 19(B) are top plan views showing structures constructed for annealing by applied current according to another embodiment of the present invention.
Figure 19B:
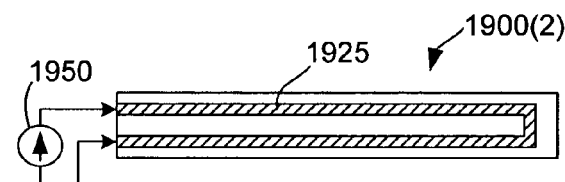

FIGS. 18(A), 18(B), 19(A), and 19(B) depict additional alternative annealing methods in which annealing is performed by passing a current through the spring structures, where resistance provided by the spring material (or other resistive structure formed on the spring material) produces localized heating. In the embodiment shown in FIG. 18(A), pre-release annealing is achieved by transmitting a current through opposite ends of a spring structure 1800(1) using a current path (e.g., using conductive traces 1805 and 1806 coupled to a current source 1830) that is incorporated into substrate 1801. In the embodiment shown in FIG. 18(A), pre-release and/or post-release annealing are achieved using probe needles 1851 and 1852, which are connected to a current source 1850 and brought into contact with opposite ends of a spring structure 1800(2). FIG. 19(A) illustrates another method whereby a current source 1930 is coupled to the fixed ends of a U-shaped spring structure 1900(1). FIG. 19(B) illustrates yet another method whereby a current source 1950 is coupled to ends of a U-shaped electrically conductive (or resistive) pattern 1925 formed on a spring structure 1900(2). In each of the embodiments shown in FIGS. 18(A) through 19(B), currents generated by the associated current are controlled to produce a desired annealing temperature, thereby controlling the amount of curvature and final tip height of the released spring structure.

In some sputtered spring structure types, the amount of stress gradient in each spring structure formed on a single wafer varies in relation to that spring structures location relative to the center of the wafer. In particular, the release tip height of such sputtered spring structures located near the center tends to be smaller than the release tip height of spring structures located adjacent to the outer edge (i.e., relatively far from the center) of the wafer.

Figure 20:
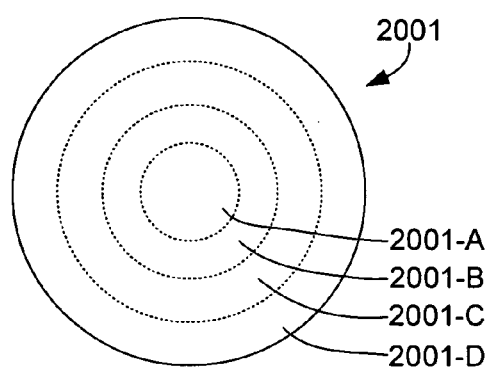
FIG. 20 is a top plan view showing a wafer that is segmented into different annealing temperature zones according to embodiment of the present invention.

According to another embodiment of the present invention, the annealing schedule for each wafer includes a tip height correction factor whereby concentric annular zones of the wafer are exposed to different annealing temperatures to produce a uniform tip height for all spring structures produced from that wafer. FIG. 20 is a top plan view showing a simplified wafer 2001 that is sectioned into four zones: central zone 2001-A, first intermediate zone 2001-B, second intermediate zone 2001-C, and outer zone 2001-D. To compensate for the variation in tip height based on proximity to the wafer center, spring structures (not shown) located in central zone 2001-A (which may be grouped as a first cache) are annealed at a higher temperature than spring structures located in first intermediate zone (second cache) 2001-B, which in turn are annealed at a higher temperature than spring structures located in second intermediate zone (third cache) 2001-C, which in turn are annealed at a higher temperature than spring structures located in outer zone (fourth cache) 2001-D. This zone-based annealing method may be executed, for example using a special hot plate capable of different temperatures below the different zones. Note that rapid thermal annealing and other heater geometries (e.g. squares) might also be used.

According to another aspect of the present invention, non-uniform annealing processes may be utilized to form angled (i.e., non-circular) spring structures (i.e., spring structures having abrupt bends at predetermined locations along the spring structure). Such angled spring structures may be used, for example, to produce angled spring probes for atomic force microscopy (AFM)) operations, such as those described in co-owned U.S. Pat. No. 6,668,628 (allowed U.S. patent application Ser. No. 10/112,215). The exemplary embodiments provided below utilize laser annealing and heat reflecting/absorbing layers to produce such angled spring structures, but the present invention is not limited to these exemplary embodiments unless otherwise specified in the appended claims.

FIG. 21 depicts a pair of spring structures 2100-1 and 2100-2 formed on a substrate 2101. According to an embodiment of the present invention, localized annealing of spring structure 2100-1 is applied by directing a short laser beam pulse 2151, which is generated by laser system 1750 (discussed above), onto a selected location 2120-1D of a spring finger 2120-1. The present inventors found that localized annealing by short laser burst causes the amount of bending of spring finger 2120-1 to change significantly at the locally heated point. FIG. 22 is a photograph showing a NiZr spring structure 2100-1 that was bent by nearly 90° using a short laser pulse directed along the path indicated by arrow 2251. By selectively and locally heating springs structures, abruptly bent spring geometries, such as that of spring structure 2100-1 of FIG. 21 and spring 2200-1 shown in FIG. 22, become possible that cannot be achieved by conventional stressy-metal processing.

FIGS. 23(A) and 23(B) depict spring structures that can be beneficially produced using the localized annealing process described with reference to FIGS. 21 and 22. FIG. 23(A) depicts a spring structure 2300-1 that is bent in one place to produce an AFM scanning probe for imaging a deep trench defined in a sample 2350. Similarly, FIG. 23(B) depicts a spring structure 2300-2 that is abruptly bent in two directions that may be produced, for example, by directing laser pulses 2151(1) and 2151(2) in the depicted manner (i.e., such that the respective beams strike the upper and lower surfaces of the spring finger). Spring structure 2300-2 may be utilized, for example, to produce an AFM scanning probe for sidewall imaging. The present inventors also found during initial experimentations that spring structures can also be twisted by directing the laser beam onto a longitudinal edge of the spring finger (i.e., instead of being directed to the center of the spring finger).

Figure 24A:
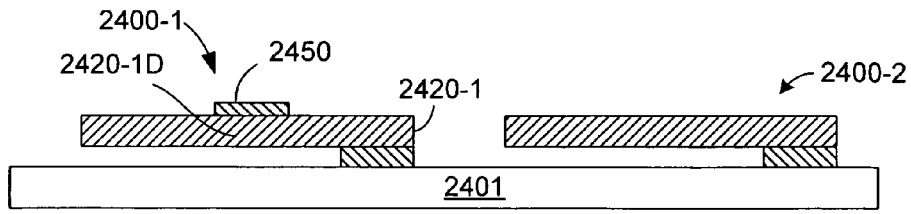
FIGS. 24(A) and 24(B) are simplified cross sectional side views showing a spring structure produced using a heat absorbent mask in accordance with an embodiment of the present invention.
Figure 24B:
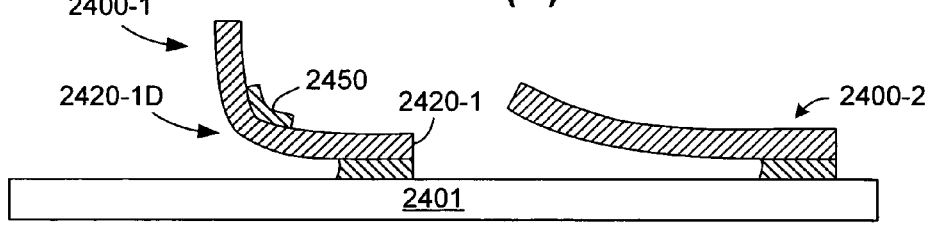

FIGS. 24(A) and 24(B) depict another method for producing a non-circular spring structure 2400-1 that utilizes a heat absorbing mask 2450 (e.g. copper, aluminum) formed over a specified region 2420-1D of spring finger 2420-1 according to another alternative embodiment of the present invention. For reference, a second spring structure 2400-2 is also illustrated. Heat absorbing mask 2450 produces a higher temperature in region 2420-1D during annealing than is produced in other sections of spring finger 2420-1, thereby producing an abrupt bend at region 2420-1D of annealed spring structure 2400-1 (shown in FIG. 24(B). In addition to the localized use of heat absorbing masks as shown in FIGS. 24(A) and 24(B), it is also possible to selectively produce both relatively flat spring structures and circular (or highly curved) spring structures on a single substrate by forming heat absorbing material along the entire length of selected spring structures (while leaving other spring structures untreated), and then performing post-release annealing as described above. One possible use of such an approach is to produce variable inductive coils on a wafer. Note also that although the example depicted in FIGS. 24(A) and 24(B) involves post-release annealing, the use of heat absorbing masks may also be used in conjunction with pre-release annealing processes.

Figure 25A:
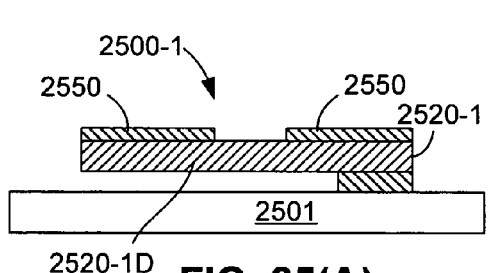
FIGS. 25(A) and 25(B) are simplified cross sectional side views showing a spring structure produced using a heat reflective mask in accordance with an embodiment of the present invention.
Figure 25B:
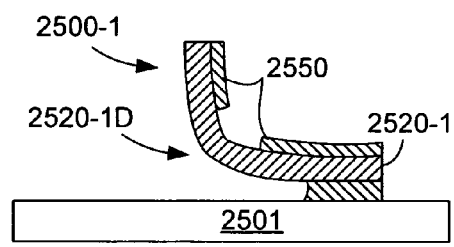

According to yet another alternative embodiment of the present invention, a heat reflecting material (e.g. silicon oxide, silicon nitride) may be utilized in a manner similar to that described above involving heat absorbing materials. For example, FIGS. 25(A) and 25(B) the production of a non-circular spring structure 2500-1 that utilizes a heat reflecting masks 2550 formed over all regions of spring finger 2520-1 except for specified region 2520-1D. Heat reflecting masks 2550 reduce the temperature in the masked regions of spring structure 2420-1, thereby effectively producing a higher temperature in region 2420-1D and causing an abrupt bend, such as that shown at region 2520-1D in FIG. 25(B). As with the heat absorbing materials, it is also possible to selectively produce both relatively flat spring structures and circular (or highly curved) spring structures on a single substrate by forming heat reflecting material along the entire length of selected spring structures (while leaving other spring structures untreated), and then performing post-release annealing or pre-release annealing as described above.

According to yet another alternative embodiment of the present invention, the various spring structures described above are fabricated using films having internal strain (as opposed to stress) gradients. For example, similar to the plated metal films described above, strain-engineered films may be fabricated with two or more materials that, when subjected to the annealing processes described above, produce a permanent volume or density change through the rearrangement of atoms within the structure. When layered to form a suitable strain gradient, this permanent change causes atoms adjacent to the substrate to spread further apart and/or atoms adjacent to the upper surface of the spring finger to pack closer together, which results in bending similar to that described above with reference to stress-engineered films. In addition to materials that exhibit such intermetallic phases, similar strain gradients can be produced using other mechanisms for the volume change, such as phase transformation, interdiffusion, precipitate formation, void collapse, and intermetallic growth, which can be incorporated into the thin film during deposition or plating (e.g., the volume change accompanying the interdiffusion of Sn (Tin) and Au (Gold)). Note that, in such strain-based spring structures, there is no requirement that the film be formed with an initial stress gradient. However, some embodiments may include both stress gradients and strain gradients.

Figure 26A:
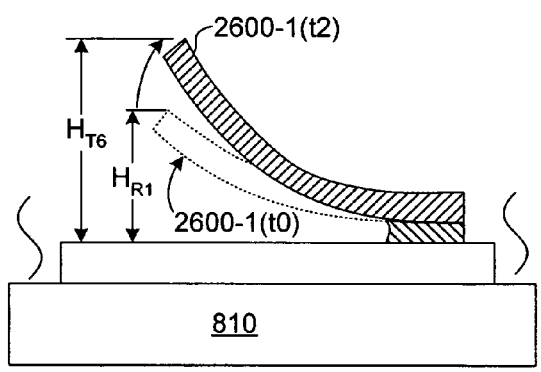
FIGS. 26(A) and 26(B) are simplified cross sectional side views showing spring structures tuned using a time-based annealing method according to another embodiment of the present invention.
Figure 26B:
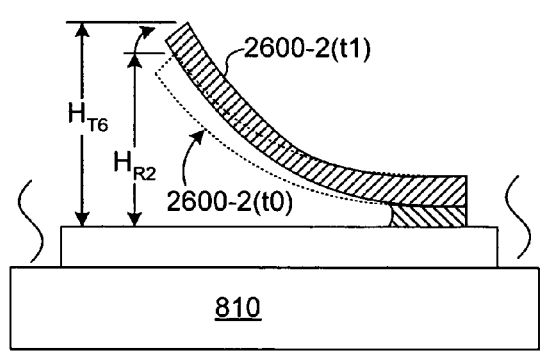
Figure 27:
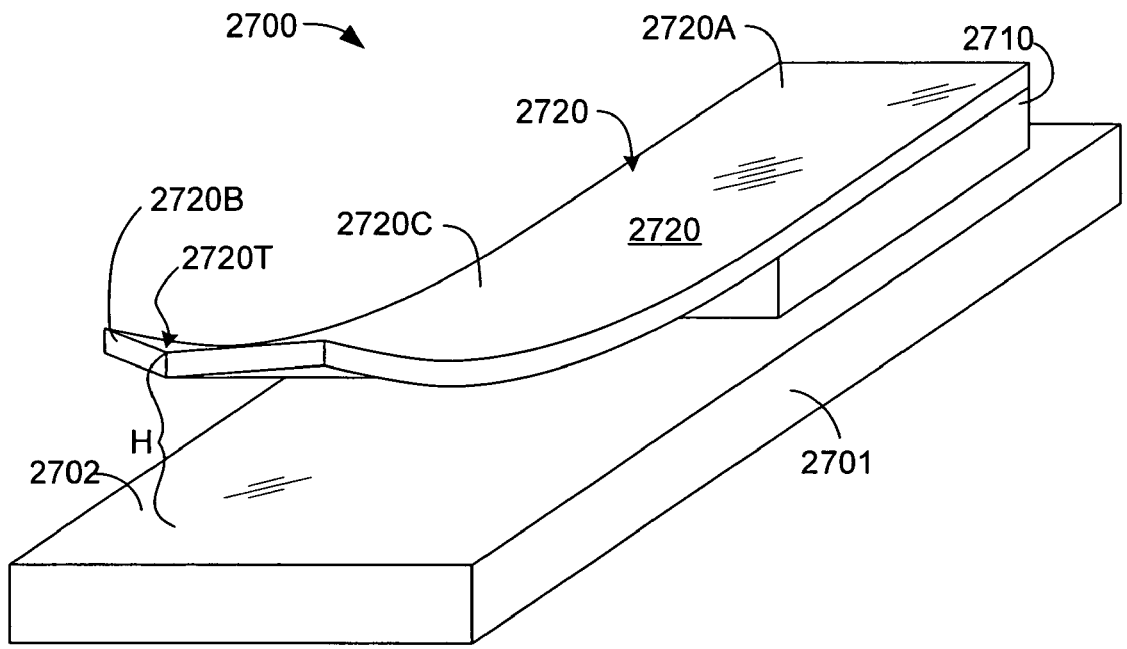
FIG. 27 is a perspective view showing a conventional spring structure.
Figure 28A:
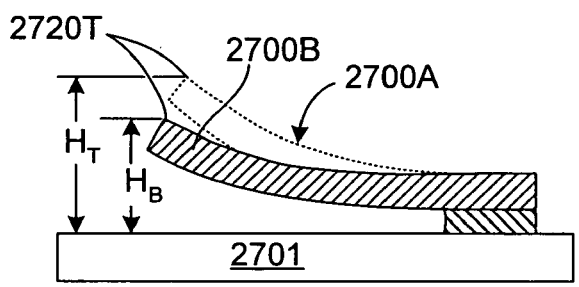
FIGS. 28(A) and 28(B) are simplified cross sectional side views showing the spring structure of FIG. 27.
Figure 28B:
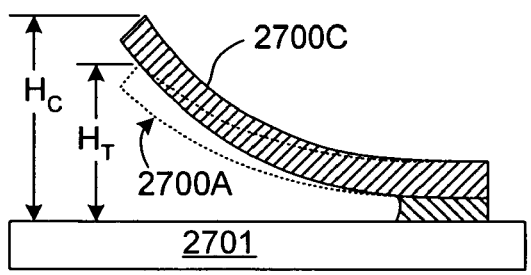

According to yet another alternative embodiment of the present invention, the tip height of selected spring structures are adjusted using annealing schedules that are based on time (with a fixed temperature), as opposed to the temperature-based annealing schedule described above. The present inventors have determined that such time-based annealing schedules are particularly effective when applied to spring structures formed by plating methods (as opposed to sputtered spring). An example of the time-based tip tuning method is depicted in FIGS. 26(A) and 26(B), which respectively show spring structures 2600-1 and 2600-2 that are fabricated using the plating-based fabrication methods described above. FIG. 26(A) shows spring structure 2600-1(t0) in dashed lines having a first release tip height $H_{R1}$ at a time t0 (i.e., after release and before annealing), and FIG. 26(B) shows spring structure 2600-2(t0) in dashed lines having a second release tip height $H_{R2}$ at time t0, where tip height $H_{R2}$ is greater than tip height $H_{R1}$. According to the present embodiment, in order to tune both spring structure 2600-1 and 2600-2 to a target tip height $H_{T6}$, wherein target tip height $H_{T6}>H_{R2}>H_{R1}$, spring structure 2600-1 is tuned at a predetermined temperature (e.g., 200° C.) for a relatively long time period (t0 to t2), and spring structure 2600-2 is tuned at the predetermined temperature for a relatively short time period (t0 to t1). As indicated in solid lines and cross-hatching in FIGS. 26(A) and 26(B), respectively, both spring structure 2600-1(t2) and 2600-2(t1) achieve the same target tip height $H_{T6}$ using the same annealing temperature. When applicable to a particular spring structure, this time-based annealing method provides a useful alternative to temperature-based annealing schedules. For example, the time-based annealing method facilitates simplified annealing using a fixed-temperature heat source (as opposed to requiring adjustment of a heat source's temperature), and the amount of tuning is determined solely by the annealing time (i.e., the longer the annealing time, the higher the tip height). This alternative annealing method also facilitates the tuning process through heating a wafer to a fixed temperature, cooling and measuring the tip heights, and then repeating this process until a target tip height is achieved. The present inventors believe that the effectiveness of time-based annealing on plated spring films may be due to the lower density of plated spring material. That is, in comparison to plated spring structures, the atoms in sputtered spring films are typically more densely packed due to ion bombardment. The lower density of the plated spring structures is believed to provide space for recrystallization over time at a specific temperature.

Although the present invention has been described with respect to certain specific embodiments, it will be clear to those skilled in the art that the inventive features of the present invention are applicable to other embodiments as well, all of which are intended to fall within the scope of the present invention.

What is claimed is:

1. A method for fabricating a spring structure including a spring finger having a first end attached to a substrate, a second end including a tip, and a central section extending between the first and second ends such that the tip is located a selected target distance from the substrate, the method comprising:

forming the spring finger on the substrate such that the first end, the second end and the central section are attached to the substrate;

releasing the central section and second end of the spring finger such that the first end remains attached to the substrate and the central section and second end are detached from the substrate; and annealing the spring finger such that the central section achieves a selected curvature and the tip is positioned at the selected target distance from the substrate, wherein said annealing includes utilizing at least one of a pre-release annealing process, which is performed before releasing the central section and second end, and a post-release annealing process, which is performed after releasing the central section and second end.

2. The method according to claim 1, wherein forming the spring finger comprises sputter depositing a metal film such that the sputtered metal film includes a stress gradient that changes in a direction perpendicular to an upper surface of the substrate.

3. The method according to claim 1, wherein forming the spring finger comprises generating a stress gradient that changes in a direction perpendicular to an upper surface of the substrate.

4. The method according to claim 1, wherein forming the spring finger comprises generating a strain gradient that changes in a direction perpendicular to an upper surface of the substrate.

5. The method according to claim 1, wherein said annealing is performed after said releasing, wherein the tip is positioned at a release tip distance from the substrate after said releasing, and said tip is positioned at the selected target distance from the substrate after annealing.

6. The method according to claim 5, wherein the spring finger is subjected to a maximum production temperature during forming and releasing, and wherein said annealing comprises heating the spring finger to a post-release annealing temperature that is greater than the maximum production temperature.

7. The method according to claim 6, further comprising:
  comparing the release tip height with the selected target distance after said releasing; and
  determining the post-release annealing temperature based on a difference between the release tip height and the selected target distance.

8. The method according to claim 6, further comprising:
  comparing the release tip height with the selected target distance after said releasing; and
  determining the post-release annealing time at a predetermined annealing temperature based on a difference between the release tip height and the selected target distance.

9. The method according to claim 1, wherein said annealing is performed before said releasing.

10. The method according to claim 9, wherein the spring finger is subjected to a maximum formation temperature during forming, and wherein annealing comprises heating the spring finger to a pre-release annealing temperature that is greater than the maximum formation temperature.

11. The method according to claim 10, further comprising:
  releasing a benchmark spring structure and measuring a benchmark tip height of the benchmark spring structure;
  comparing the benchmark tip height with the selected target distance; and
  determining the pre-release annealing temperature based on a difference between the benchmark tip height and the selected target distance.

12. The method according to claim 9, wherein annealing further comprises heating the spring finger after said releasing to a second annealing temperature that is greater than the pre-release annealing temperature.

13. The method according to claim 9, wherein annealing further comprises heating the spring finger after said releasing to a post-release annealing temperature.

14. The method according to claim 13, wherein the post-release annealing temperature is greater than or equal to the pre-release annealing temperature.

15. The method according to claim 1, further comprising determining an expected maximum temperature to which the spring structure will be subjected, and wherein said annealing comprises heating to an annealing temperature that is greater than or equal to the expected maximum temperature.

16. The method according to claim 1, wherein said annealing comprises uniformly heating the substrate using one of a hot plate and an oven.

17. The method according to claim 1, wherein said annealing comprises directing a laser beam onto the spring finger.

18. The method according to claim 1, wherein said annealing comprises passing a current through the spring finger.

19. The method according to claim 1, wherein said annealing comprises said annealing a first section of the spring finger at a first, relatively high temperature, and annealing a second section of the spring finger at a second, relatively low temperature, whereby a greater curvature is generated in the first region than in the second region.

20. The method according to claim 19, wherein said annealing comprises heating the first section to the first temperature using a laser beam.

21. The method according to claim 19, wherein said annealing comprises forming one of a heat absorbing material and a heat reflecting material on the spring finger.

22. A method for fabricating a spring structure including a spring finger having a first end attached to a substrate, a second end including a tip, and a curved central section extending between the first and second ends such that the tip is located a selected target distance from the substrate, the method comprising:
  forming the spring finger on the substrate such that the first end, the second end and the central section are attached to the substrate;
  annealing the spring finger at a pre-release annealing temperature while the first end, the second end, and the central section are attached to the substrate; and
  releasing the central section and second end of the annealed spring finger such that the first end remains attached to the substrate and the central section and second end are detached from the substrate.

23. The method according to claim 22, wherein forming the spring finger comprises sputter generating a stress gradient that changes in a direction perpendicular to an upper surface of the substrate.

24. The method according to claim 22, wherein forming the spring finger comprises generating a stress gradient that changes in a direction perpendicular to an upper surface of the substrate.

25. The method according to claim 22, wherein forming the spring finger comprises depositing a metal film over the substrate such that the metal film includes a strain gradient that changes in a direction perpendicular to an upper surface of the substrate.

26. The method according to claim 22, wherein the spring finger is subjected to a maximum formation temperature during forming, wherein annealing comprises heating the spring finger to the pre-release annealing temperature, and wherein the pre-release annealing temperature is greater than the maximum formation temperature.

27. The method according to claim 26, further comprising:
  releasing a benchmark spring structure and measuring a benchmark tip height of the benchmark spring structure;
  comparing the benchmark tip height with the selected target distance; and
  determining the pre-release annealing temperature based on a difference between the benchmark tip height and the selected target distance.

28. The method according to claim 26, further comprising:
  releasing a benchmark spring structure and measuring a benchmark tip height of the benchmark spring structure;
  comparing the benchmark tip height with the selected target distance; and
  determining an annealing time period at the pre-release annealing time based on a difference between the benchmark tip height and the selected target distance.

29. The method according to claim 22, further comprises heating the spring finger after said releasing to a post-release annealing temperature that is greater than the pre-release annealing temperature.

30. The method according to claim 22, further comprising determining an expected maximum temperature to which the spring structure will be subjected, wherein said pre-release annealing temperature is greater than or equal to the expected maximum temperature.

31. The method according to claim 22, wherein said annealing comprises uniformly heating the substrate using one of a hot plate and an oven.

32. The method according to claim 22, wherein said annealing comprises directing a laser beam onto the spring finger.

33. A method for fabricating a plurality of spring structures on a substrate, each spring structure including a spring finger having a first end attached to the substrate, a second end including a tip, and a curved central section extending between the first and second ends such that the tip is located a selected target distance from the substrate, the method comprising:
  forming the plurality of spring structures on the substrate such that the first end, the second end and the central section of each spring finger are attached to the substrate;
  releasing the central section and second end of a first spring structure such that the first end remains attached to the substrate, and the central section and second end are detached from the substrate such that the tip of the first spring structure is located at a benchmark distance from the substrate;
  comparing the benchmark distance and the selected target distance;
  determining a pre-release annealing temperature based on a difference between the benchmark distance and the selected target distance;
  annealing a second spring structure at the determined pre-release annealing temperature; and
  releasing the central section and second end of the annealed second spring structure such that the first end remains attached to the substrate, and the central section bends away from the substrate, wherein the tip of the second spring structure is positioned at the predetermined distance from the substrate.

34. The method according to claim 33, wherein forming the spring finger of each of the plurality of spring structures comprises sputter depositing a metal film such that the sputtered metal film includes a stress gradient that changes in a direction perpendicular to an upper surface of the substrate.

35. The method according to claim 33, wherein forming the spring finger of each of the plurality of spring structures comprises plating a metal film over the substrate such that the plated metal film includes a stress gradient that changes in a direction perpendicular to an upper surface of the substrate.

36. The method according to claim 33, wherein forming the spring finger of each of the plurality of spring structures comprises depositing a metal film over the substrate such that the metal film includes a strain gradient that changes in a direction perpendicular to an upper surface of the substrate.

37. The method according to claim 33, wherein the spring finger of each of the plurality of spring structures is subjected to a maximum formation temperature during forming, and wherein the pre-release annealing temperature is greater than the maximum formation temperature.

38. The method according to claim 33, further comprises heating the spring finger of the second spring structure after said releasing to a post-release annealing temperature that is greater than the pre-release annealing temperature.

39. The method according to claim 33, further comprising determining an expected maximum temperature to which the spring structure will be subjected, wherein said pre-release annealing temperature is greater than or equal to the expected maximum temperature.

40. The method according to claim 33, wherein said annealing comprises uniformly heating the substrate using one of a hot plate and an oven.

41. The method according to claim 33, wherein said annealing comprises directing a laser beam onto the spring finger.

42. The method according to claim 33, wherein said annealing comprises passing a current through the spring finger.

43. A method for fabricating a spring structure on a substrate, the spring structure including a first end attached to the substrate, a second end including a tip, and a curved central section extending between the first and second ends such that the tip is located a selected target distance from the substrate, the method comprising:
  forming the spring finger on the substrate such that the first end, the second end and the central section are attached to the substrate;
  releasing the central section and second end of the spring finger such that the first end remains attached to the substrate and the central section and second end are detached from the substrate;
  comparing an initial tip height, which is measured between the tip of the released spring finger and the substrate, with the selected target distance;
  determining a post-release annealing temperature based on a difference between the initial tip height and the selected target distance; and
  annealing the released spring structure at the post-release annealing temperature such that the central section bends away from the substrate, and the tip of the spring structure is positioned at the selected target distance from the substrate.

44. The method according to claim 43, wherein forming the spring finger comprises sputter depositing a metal film such that the sputtered metal film includes a stress gradient that changes in a direction perpendicular to an upper surface of the substrate.

45. The method according to claim 43, wherein forming the spring finger comprises plating a metal film over the substrate such that the plated metal film includes a stress gradient that changes in a direction perpendicular to an upper surface of the substrate.

46. The method according to claim 43, wherein forming the spring finger comprises depositing a metal film over the substrate such that the metal film includes a strain gradient that changes in a direction perpendicular to an upper surface of the substrate.

47. The method according to claim 43, wherein the spring finger is subjected to a maximum production temperature during forming and releasing, and wherein the post-release annealing temperature is greater than the maximum production temperature.

48. The method according to claim 43, further comprising determining an expected maximum temperature to which the spring structure will be subjected during operation, and wherein the post-release annealing temperature is greater than or equal to the expected maximum temperature.

49. The method according to claim 43, wherein said annealing comprises uniformly heating the substrate using one of a hot plate and an oven.

50. The method according to claim 43, wherein said annealing comprises directing a laser beam onto the spring finger.

51. The method according to claim 43, wherein said annealing comprises passing a current through the spring finger.

52. A method for fabricating a plurality of spring structures on a substrate, each spring structure including a spring finger first end attached to a substrate, a second end including a tip, and a curved central section extending between the first and second ends such that the tip is located a selected target distance from the substrate, the method comprising:
  forming first and second spring structures on the substrate such that the first end, the second end and the central section of the spring fingers associated with the first and second spring structures are attached to the substrate;
  releasing the central section and second end of the spring fingers associated with the first and second spring structures such that the first ends of the spring fingers associated with the first and second spring structures remain attached to the substrate and the central sections and second ends of the spring fingers associated with the first and second spring structures are detached from the substrate;
  comparing the selected target distance with a first initial distance measured between the tip of the first spring structure and the substrate, and with a second initial distance measured between the tip of the second spring structure and the substrate;
  determining a first annealing temperature based on the first measured initial distance and a second annealing temperature based on the second measured initial distance; and
  annealing the first spring structure at the first annealing temperature such that the central section of the first spring structure bends away from the substrate until the tip of the first spring structure is located at the selected target distance from the substrate, and annealing the second spring structure at the second annealing temperature such that the central section of the second spring structure bends away from the substrate until the tip of the second spring structure is located at the selected target distance from the substrate.

53. A method for mass producing a plurality of spring structures, each spring structure including a spring finger having a first end attached to an associated substrate, a second end including a tip, and a central section extending between the first and second ends such that the tip is located a target distance from the associated substrate, the method comprising:
  producing a cache of unreleased spring structures including a first spring structure formed on a first substrate and a second spring structure formed on a second substrate, wherein the first end, the second end, and the central section of the spring fingers associated with each unreleased spring structure are attached to the substrate;
  annealing and releasing a first spring structure from the cache of unreleased spring structures according to a first annealing schedule of the plurality of annealing schedules, whereby the tip of the first spring structure is located a first target distance from the associated substrate; and
  annealing and releasing a second spring structure from the cache of unreleased spring structures according to a second annealing schedule of the plurality of annealing schedules, whereby the tip of the second spring structure is located a second target distance from the associated substrate.

54. The method according to claim 53, wherein producing the cache comprises fabricating the unreleased first and second spring structures such that the first and second spring structures have a common stress gradient.

55. The method according to claim 53, wherein producing the cache comprises fabricating the unreleased first and second spring structures such that the first and second spring structures have a common strain gradient.

56. The method according to claim 53, further comprising determining the first annealing schedule and the second annealing schedule before annealing the first and second spring structures.

57. A method for fabricating a spring structure including a spring finger having a first end attached to a substrate, a second end including a tip, and a central section extending between the first and second ends such that the tip is located a selected target distance from the substrate, the method comprising:
  forming the spring finger on the substrate such that the first end, the second end and the central section are attached to the substrate;
  releasing the central section and second end of the spring finger such that the first end remains attached to the substrate and the central section and second end are detached from the substrate, whereby the tip is positioned at a release distance from the substrate, wherein the release distance is less than the selected target distance;
  annealing the spring finger at a predetermined annealing temperature for an annealing time period such that the central section bends away from the substrate and the tip is positioned at the selected target distance;
  wherein the annealing time period is calculated based on the predetermined annealing temperature and a difference between the release distance and the selected target distance.

58. The method according to claim 57, wherein forming the spring finger of each of the plurality of spring structures comprises plating a metal film over the substrate such that the plated metal film includes a stress gradient that changes in a direction perpendicular to an upper surface of the substrate.

59. The method according to claim 57, wherein forming the spring finger of each of the plurality of spring structures comprises depositing a metal film over the substrate such that the metal film includes a strain gradient that changes in a direction perpendicular to an upper surface of the substrate.

60. The method according to claim 57, wherein the spring finger is subjected to a maximum production temperature during forming and releasing, and wherein said predetermined annealing temperature is greater than the maximum production temperature.

61. A method for fabricating a plurality of spring structures on a substrate, each spring structure including a spring finger first end attached to a substrate, a second end including a tip, and a curved central section extending between the first and second ends such that the tip is located a selected target distance from the substrate, the method comprising:

forming first and second spring structures on the substrate such that the first end, the second end and the central section of the spring fingers associated with the first and second spring structures are attached to the substrate;

releasing the central section and second end of the spring fingers associated with the first and second spring structures such that the first ends of the spring fingers associated with the first and second spring structures remain attached to the substrate and the central sections and second ends of the spring fingers associated with the first and second spring structures are detached from the substrate;

comparing the selected target distance with a first initial distance measured between the tip of the first spring structure and the substrate, and with a second initial distance measured between the tip of the second spring structure and the substrate, wherein the first initial distance is less than the second initial distance;

determining a first annealing time period based on the first measured initial distance, and a second annealing time period based on the second measured initial distance; and annealing the first spring structure at a predetermined annealing temperature for the first annealing time period such that the central section of the first spring structure bends away from the substrate until the tip of the first spring structure is located at the selected target distance from the substrate, and annealing the second spring structure for the second annealing time period such that the central section of the second spring structure bends away from the substrate until the tip of the second spring structure is located at the selected target distance from the substrate, wherein the first annealing time period is greater than the second annealing time period.

\* \* \* \* \*